United States Patent
Ware et al.

(10) Patent No.: US 11,211,114 B2
(45) Date of Patent: Dec. 28, 2021

(54) MEMORIES AND MEMORY COMPONENTS WITH INTERCONNECTED AND REDUNDANT DATA INTERFACES

(71) Applicant: Rambus Inc., Sunnyvale, CA (US)

(72) Inventors: Frederick A. Ware, Los Altos Hills, CA (US); Ely K. Tsern, Los Altos, CA (US); John E. Linstadt, Palo Alto, CA (US); Thomas J. Giovannini, San Jose, CA (US); Scott C. Best, Palo Alto, CA (US); Kenneth L. Wright, Sunnyvale, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 16/503,189

(22) Filed: Jul. 3, 2019

(65) Prior Publication Data

US 2019/0378560 A1 Dec. 12, 2019

Related U.S. Application Data

(63) Continuation of application No. 15/552,569, filed as application No. PCT/US2016/018929 on Feb. 22, 2016, now Pat. No. 10,360,972.

(Continued)

(51) Int. Cl.
*G11C 5/02* (2006.01)
*G11C 11/4093* (2006.01)
(Continued)

(52) U.S. Cl.
CPC .......... *G11C 11/4093* (2013.01); *G11C 5/025* (2013.01); *G11C 5/063* (2013.01);
(Continued)

(58) Field of Classification Search
CPC .. G11C 11/4093; G11C 11/4076; G11C 5/025; G11C 5/063; G11C 11/408; G11C 11/4096
(Continued)

(56) References Cited

U.S. PATENT DOCUMENTS 6,636,935 B1 * 10/2003 Ware ................... G06F 13/1684
                                                      365/221
6,742,098 B1    5/2004 Halbert et al.
(Continued)

FOREIGN PATENT DOCUMENTS

WO  WO-2014-062543 A2   4/2014

OTHER PUBLICATIONS

"Draft Standard for a High-Speed Memory Interface (SyncLink)," Draft 0.99 IEEE P1596.7-199X, pp. 1-56 (1996), Microprocessor and Microcomputer Standards Subcommittee of the IEEE Computer Society. 66 pages.
(Continued)

*Primary Examiner* — Alfredo Bermudez Lozada
(74) *Attorney, Agent, or Firm* — Silicon Edge Law Group LLP; Arthur J. Behiel

(57) ABSTRACT

A memory system includes dynamic random-access memory (DRAM) components that include interconnected and redundant component data interfaces. The redundant interfaces facilitate memory interconnect topologies that accommodate considerably more DRAM components per memory channel than do traditional memory systems, and thus offer considerably more memory capacity per channel, without concomitant reductions in signaling speeds. Each DRAM component includes multiplexers that allow either of the data interfaces to write data to or read data from a common set of memory banks, and to selectively relay write and read data to and from other components, bypassing the
(Continued)

local banks. Delay elements can impose selected read/write delays to align read and write transactions from and to disparate DRAM components.

21 Claims, 23 Drawing Sheets

Related U.S. Application Data

(60) Provisional application No. 62/220,971, filed on Sep. 19, 2015, provisional application No. 62/130,810, filed on Mar. 10, 2015.

(51) Int. Cl.
| | |
|---|---|
| *G11C 5/06* | (2006.01) |
| *G11C 11/4076* | (2006.01) |
| *G11C 11/408* | (2006.01) |
| *G11C 29/00* | (2006.01) |
| *H01L 25/065* | (2006.01) |
| *H01L 25/10* | (2006.01) |
| *G11C 11/4096* | (2006.01) |
| *H01L 25/18* | (2006.01) |
| *G11C 7/10* | (2006.01) |
| *G11C 8/12* | (2006.01) |
| *H01L 23/00* | (2006.01) |

(52) U.S. Cl.
CPC ........ *G11C 11/408* (2013.01); *G11C 11/4076* (2013.01); *G11C 11/4096* (2013.01); *G11C 29/824* (2013.01); *H01L 25/0652* (2013.01); *H01L 25/0655* (2013.01); *H01L 25/0657* (2013.01); *H01L 25/105* (2013.01); *H01L 25/18* (2013.01); *G11C 7/10* (2013.01); *G11C 7/1012* (2013.01); *G11C 7/1066* (2013.01); *G11C 7/1093* (2013.01); *G11C 8/12* (2013.01); *H01L 24/16* (2013.01); *H01L 24/48* (2013.01); *H01L 2224/0401* (2013.01); *H01L 2224/04042* (2013.01); *H01L 2224/06135* (2013.01); *H01L 2224/06136* (2013.01); *H01L 2224/13025* (2013.01); *H01L 2224/16146* (2013.01); *H01L 2224/16227* (2013.01); *H01L 2224/17181* (2013.01); *H01L 2224/4824* (2013.01); *H01L 2224/48091* (2013.01); *H01L 2224/48227* (2013.01); *H01L 2225/0651* (2013.01); *H01L 2225/06513* (2013.01); *H01L 2225/06517* (2013.01); *H01L 2225/06541* (2013.01); *H01L 2225/06558* (2013.01); *H01L 2225/06562* (2013.01); *H01L 2225/06572* (2013.01); *H01L 2225/06586* (2013.01); *H01L 2225/1023* (2013.01); *H01L 2225/1058* (2013.01); *H01L 2924/00014* (2013.01); *H01L 2924/14* (2013.01); *H01L 2924/1436* (2013.01); *H01L 2924/15192* (2013.01); *H01L 2924/15311* (2013.01); *H01L 2924/15331* (2013.01); *H01L 2924/181* (2013.01)

(58) Field of Classification Search
USPC ......................................................... 365/51
See application file for complete search history.

(56) References Cited

U.S. PATENT DOCUMENTS

| | | |
|---|---|---|
| 6,769,050 B1 | 7/2004 | Ware et al. |
| 6,785,782 B1 | 8/2004 | Ware et al. |
| 6,826,657 B1 | 11/2004 | Ware et al. |
| 6,889,304 B2 | 5/2005 | Perego et al. |
| 7,539,812 B2 | 5/2009 | Tetrick |
| 7,577,789 B2 | 8/2009 | Perego et al. |
| 8,069,379 B2 | 11/2011 | Perego et al. |
| 8,094,504 B2 | 1/2012 | Smolka |
| 8,139,390 B2 | 3/2012 | Oh |
| 8,407,395 B2 | 3/2013 | Kim et al. |
| 8,582,382 B2 | 11/2013 | Oh |
| 2007/0081546 A1 | 4/2007 | Yap et al. |
| 2009/0063785 A1 | 3/2009 | Gower et al. |
| 2011/0246746 A1 | 10/2011 | Keeth et al. |
| 2011/0289258 A1 | 11/2011 | Ware |
| 2012/0159045 A1 | 6/2012 | Hinkle et al. |
| 2013/0254495 A1 | 9/2013 | Kim et al. |
| 2013/0272049 A1 | 10/2013 | Vogt et al. |
| 2013/0279280 A1 | 10/2013 | Franzon et al. |
| 2014/0052934 A1 | 2/2014 | Gopalakrishnan et al. |
| 2014/0101382 A1 | 4/2014 | Kaviani et al. |
| 2014/0104935 A1* | 4/2014 | Ware ............... G11C 7/1087 365/154 |
| 2014/0226420 A1 | 8/2014 | Best |
| 2014/0237152 A1 | 8/2014 | Amirkhany et al. |
| 2014/0247637 A1 | 9/2014 | Best et al. |
| 2014/0362630 A1 | 12/2014 | Vogt |

OTHER PUBLICATIONS

"IEEE Standard for High-Bandwidth Memory Interface Based on Scalable Coherent Interface (SCI) Signaling Technology (RamLink)", IEEE Std., p. 1596.4-1996, Sep. 15, 1996. 100 pages.

Diamond, Stephen L., "SyncLink: high-speed DRAM for the future", Micro, IEEE, vol. 16, No. 6, pp. 74-75, Dec. 1996. 2 pages.

Gjessing, S. et al., "A RAM link for high speed", IEEE Spectrum, Oct. 1992, pp. 52-53.

IEEE Standard for Scalable Coherent Interface (SCI), "Microprocessor and Microcomputer Standards Subcommittee of the IEEE Computer Society," IEEE Std. 1596-1992, Aug. 2, 1993. 271 pages.

Notification of Transmittal of the International Search Report and the Written Opinion of the International Searching Authority with dated Apr. 25, 2016 re Int'l. Appln. No. PCT/US2016/018929. 12 Pages.

Wiggers, H., "SyncLink A Proposal for an Implementation of IEEE P1596.4", Hewlett Packard, pp. 1-20 (Mar. 1995).

* cited by examiner

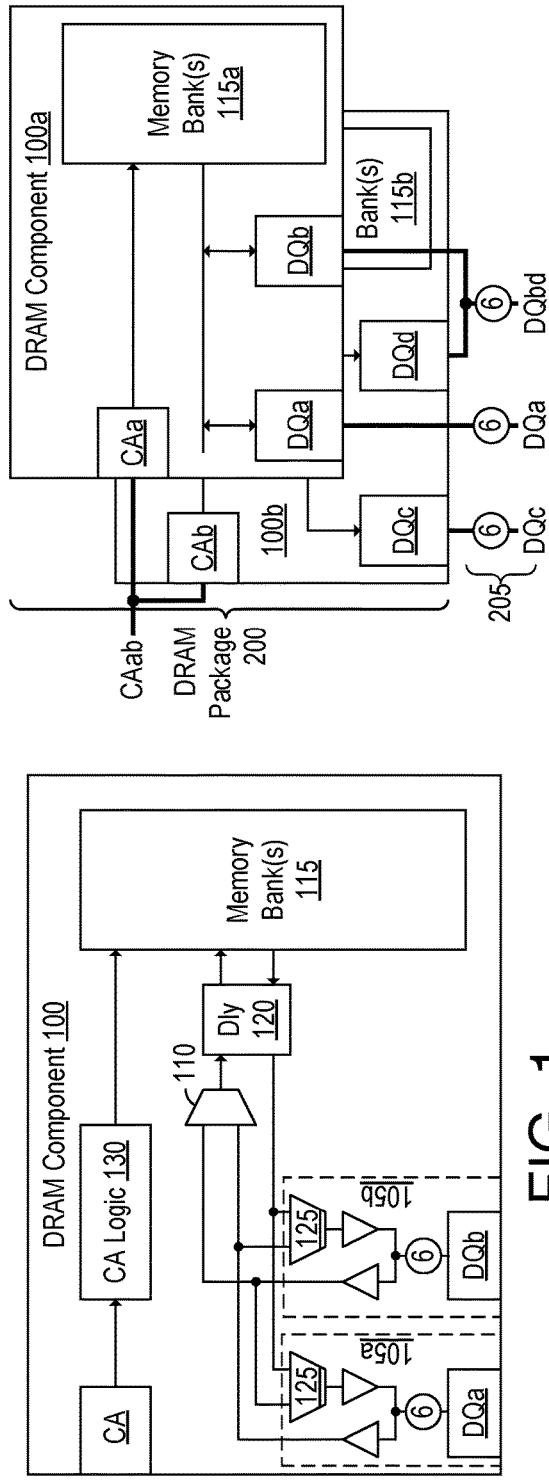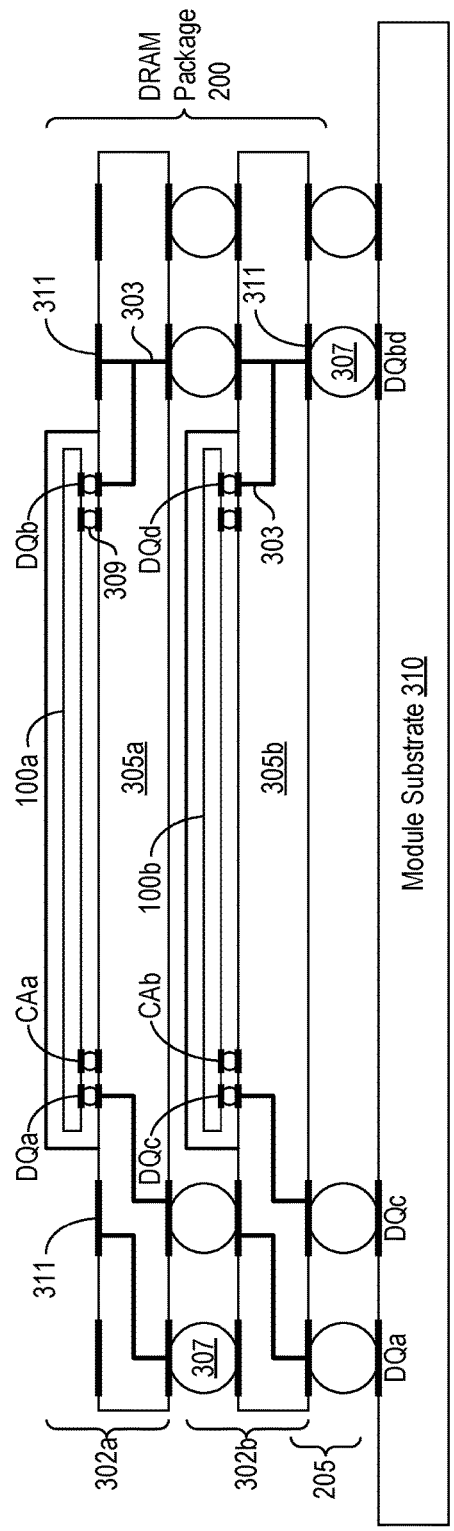

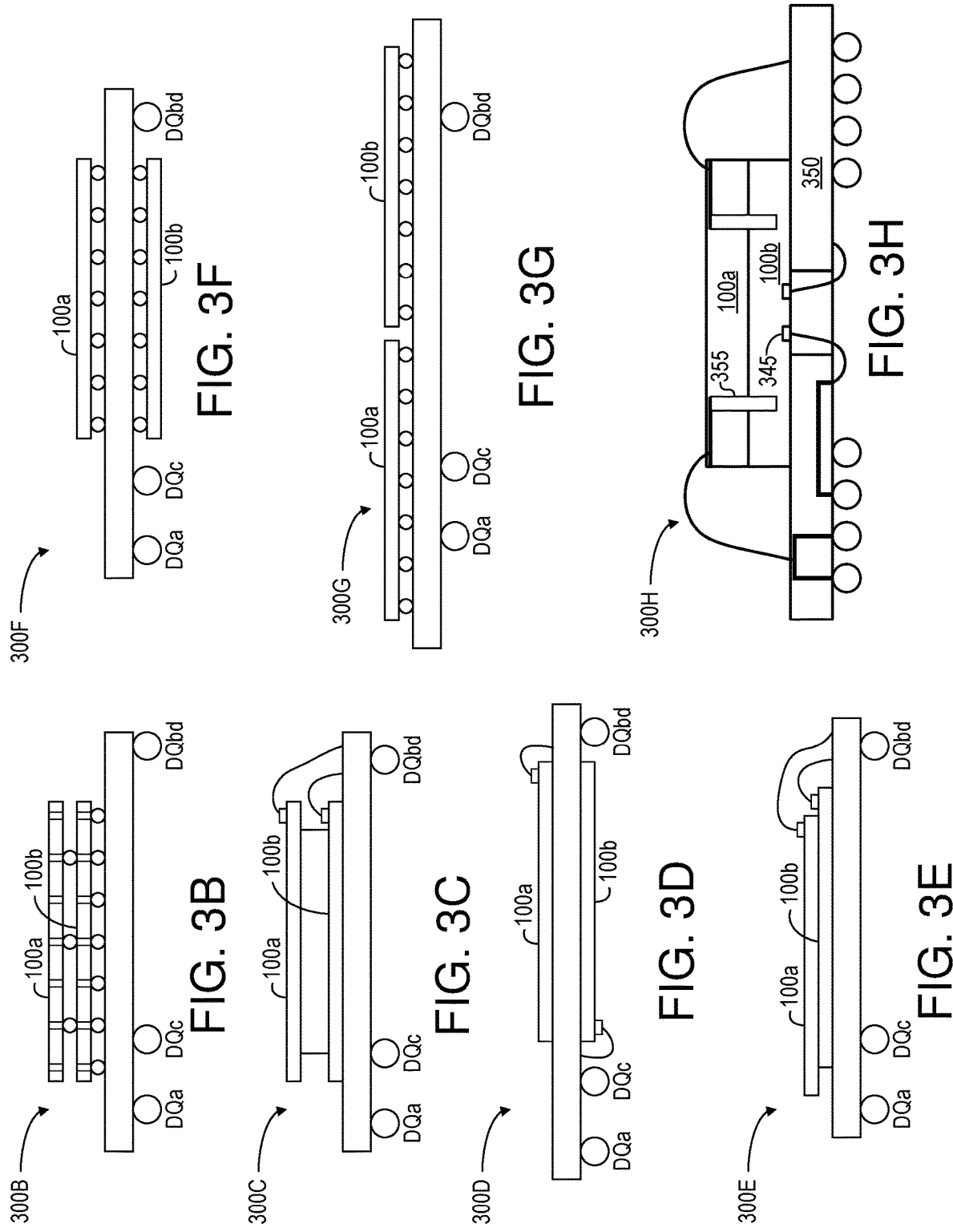

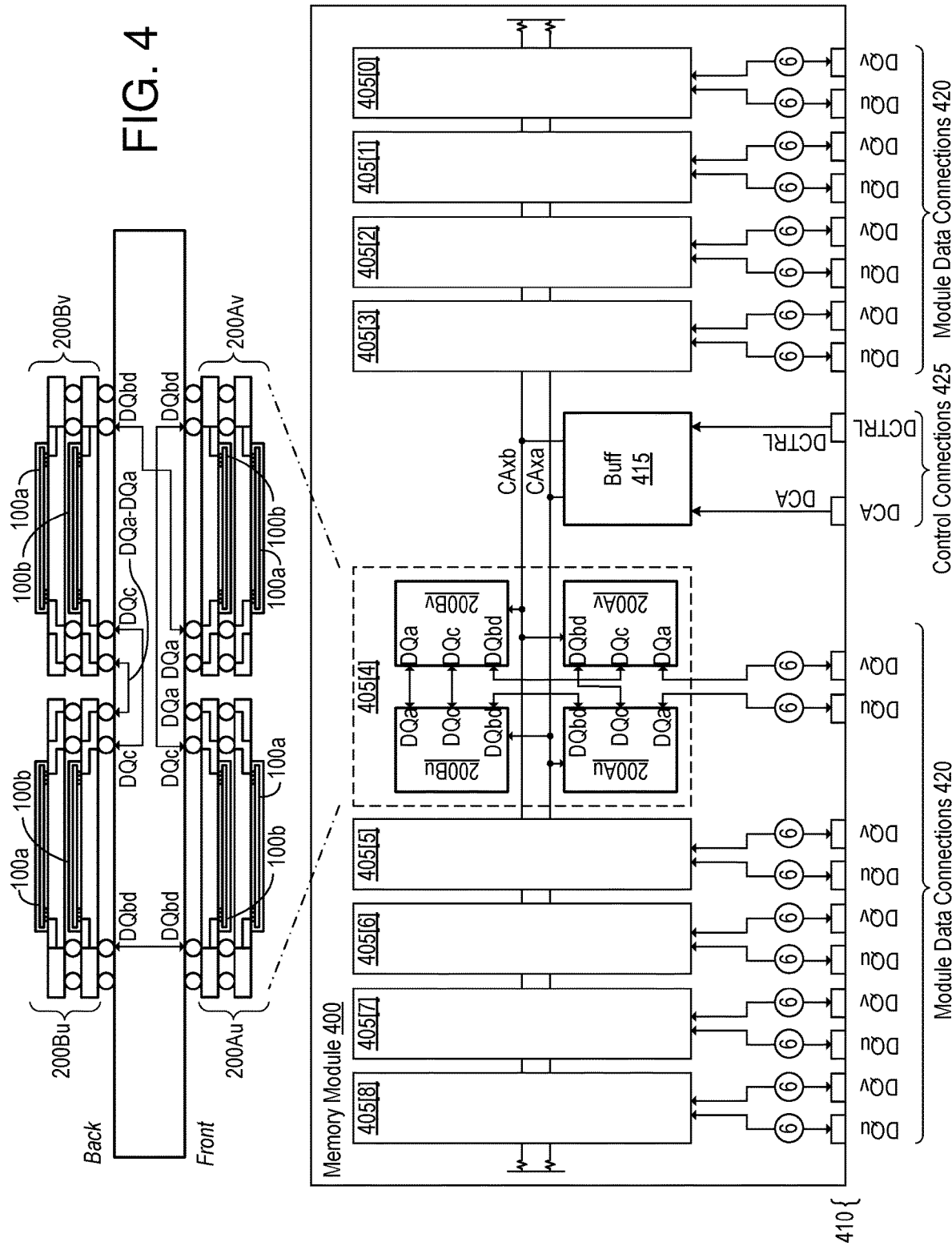

MEMORIES AND MEMORY COMPONENTS WITH INTERCONNECTED AND REDUNDANT DATA INTERFACES

BACKGROUND

Personal computers, workstations, and servers are general-purpose devices that can be programmed to automatically carry out arithmetic or logical operations. These devices include at least one processor, such as a central processing unit (CPU), and some form of memory system. The processor executes instructions and manipulates data stored in the memory.

Memory systems commonly include a memory controller that communicates with some number of memory modules via multi-wire physical connections called "channels." Each memory module commonly includes dynamic random access memory (DRAM) components mounted on a printed circuit board. Successive generations of DRAM components have benefitted from steadily shrinking lithographic feature sizes. Storage capacity and signaling rates have improved as a result.

One metric of memory-system design that has not shown comparable improvement is the number of modules one can connect to a single channel. Adding a module to a channel increases the "load" on that channel, and thus degrades signaling integrity and limits signaling rates. The number of modules per memory channel has thus eroded with increased signaling rates.

BRIEF DESCRIPTION OF DRAWINGS

FIG. 1 depicts a DRAM component 100 that includes redundant and interconnected first and second component data interfaces 105$a$ and 105$b$.

FIG. 2 depicts a DRAM package 200 comprised of two DRAM components 100, each an instance of DRAM component 100 of FIG. 1.

FIG. 3A depicts a portion of a memory module 300 upon which is mounted an embodiment of DRAM package 200 of FIG. 2.

FIGS. 3B-3H depict respective modules 300B-300H, packaging alternatives that can provide connectivity to DRAM components that is functionally equivalent module 300 of FIG. 3A.

FIG. 4 depicts a memory module 400 in accordance with an embodiment that includes nine collections 405[8:0] of DRAM packages, each collection including a pair of frontside DRAM packages 200A and a pair of backside DRAM packages 200B.

DETAILED DESCRIPTION

Figure 5A:
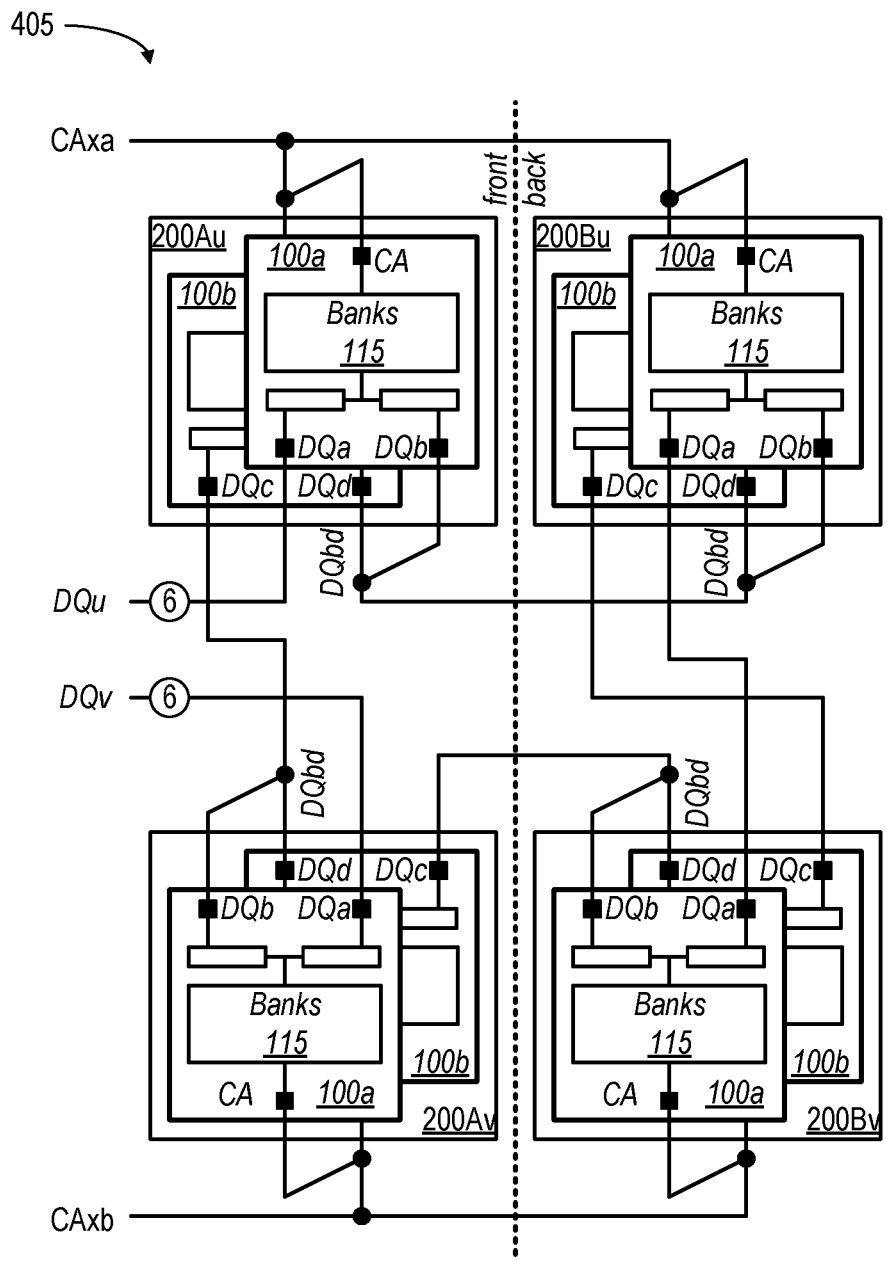
FIG. 5A depicts one of DRAM collections 405[8:0] of FIG. 4 to highlight connectivity between and among the constituent packages 200 and components 100.

FIG. 1 depicts a DRAM component 100 that includes redundant and interconnected first and second component data interfaces 105$a$ and 105$b$. The redundant interfaces 105$a$ and 105$b$ facilitate memory interconnect topologies that accommodate considerably more DRAM components per memory channel than do traditional memory systems, and thus offer considerably more memory capacity per channel, without concomitant reductions in signaling speeds.

A multiplexer 110 allows either of data interfaces 105$a$ and 105$b$ to write data to a memory bank or banks 115 via a configurable delay element 120. Multiplexers 125, one in each of interfaces 105$a$ and 105$b$, selectively convey read data from memory bank 115 to a respective data port DQa or DQb. Multiplexers 125 also allow component 100 to relay write and read data to and from other components 100, bypassing the local bank 115. Delay element 120 can impose selected read/write delays to align read and write transactions from and to disparate DRAM components 100.

Each of data ports DQa and DQb convey nibbles of data, where a nibble is four bits. Each port includes six conductors, however, as two are used to communicate differential strobe signals DQSa± and DQSb± that serve as timing references for the accompanying data signals. A command/address interface CA conveys control signals (e.g. command, addresses, and chip-select signals) to CA logic 135, which manages memory transactions with banks 115 and controls the states of multiplexers 110 and 125.

DRAM component 100 includes but one integrated circuit (IC) memory die in this example. In other embodiments, however, DRAM component 100 can include a "master die" with the type of circuitry shown here with additional DRAM dies stacked and interconnected with the master die using e.g. through-silicon vias (TSVs) for the die data and control interfaces. In one example, component 100 can include a stack of e.g. eight DRAM die that can be independently chip-selected by CA logic 130.

FIG. 2 depicts a DRAM package 200—also called a DRAM "stack"—comprised of two DRAM components 100a and 100b, each an instance of DRAM component 100 of FIG. 1. Element names for components of DRAM components 100 end with a lower-case letters where needed distinguish between them. For example, interfaces CAa and CAb are coupled in parallel such that memory package 200 includes a command/address port CAab common to both components 100.

The first memory component 100a includes first and second component data interfaces DQa and DQb as described in connection with FIG. 1. The second memory component 100b includes similar third and fourth component data interfaces DQc and DQd. Component data interfaces DQb and DQd are coupled in parallel to create a common package data interface DQbd. Data interfaces DQa and DQc remain separate so that DRAM package includes three nibble-wide package data interfaces DQa, DQc, and DQdb that are accessible via a package connector 205. As noted previously, each of these data ports conveys four bits of data (a nibble) and a differential strobe signal, for a total of six conductors. The strobe signals are omitted here for ease of illustration.

FIG. 3A depicts a portion of a memory module 300, a printed-circuit board (PCB) upon which is mounted an embodiment of DRAM package 200 of FIG. 2. Package 200 includes two sub-packages 302a and 302b with respective package substrates 305a and 305b wired to provide the connectivity illustrated in FIG. 2. Large connection balls 307 on the bottom of substrate 305a couple to pads on the top of substrate 305b. Similarly, the large connection balls on the bottom of substrate 305b serve as the package connector to couple to pads on a module substrate 310, e.g., a printed-circuit board. (Different types of package and sub-package connectors can be used, some of which are depicted in FIGS. 3B-3H.)

Both substrates 305a and 305b provide the same wiring patterns. A conductive trace 303 connects each (large) package connection ball 307 to a small connection ball (e.g. a C4 ball 309) on one of DRAM components 100a and 100b. On the right side of the package substrate, each connection ball 307 is coupled with the connection pad 311 directly above it. This forms a point-to-two-point (P-to-2P) connection topology for both data ports DQb and DQd. The same P-to-2P topology is used for CA ports CAa and CAb, but this detail is omitted here. The left sides of substrates 305a and 305b are different from the right; each connection ball is coupled with the connection pad above it and shifted one position to the right. These shifts form point-to-point (P-to-P) connection topologies for each of ports DQb and DQd.

FIGS. 3B-3H depict respective modules 300B-300H, packaging alternatives that can provide connectivity to DRAM components that is functionally equivalent module 300 of FIG. 3A. Modules 300B-300H can be customized to allow a mix of P-to-2p and P-to-P link topologies to be used by two DRAM components 100a and 100b. As detailed below, these topologies allow the second DQ interface on each DRAM component to be used to improve the capacity range and the performance of the system.

In FIG. 3H, component 100b supports center-stripe input/output pads 345 that connect to conductors within a module substrate 350 via wire bonds that extend through a window in the substrate. Component 100a is edge bonded to module substrate 350. Through-silicon vias (TSVs) 355 can be included to communicate signals between components 100a and 100b.

FIG. 4 depicts a memory module 400 in accordance with an embodiment that includes nine collections 405[8:0] of DRAM packages, each collection including a pair of front-side DRAM packages 200A and a pair of backside DRAM packages 200B. Each package 200A/B includes two DRAM components 100a and 100b, so each collection 405[#] includes eight, and module 400 includes seventy-two. Examples of DRAM components 100a/b and DRAM packages 200A/B are detailed above in connection with respective FIGS. 1 and 2. The top of FIG. 4 depicts a side-view of one manner of mounting four packages, a pair of packages 200Au and 200Av on the front side of module 400 and a pair of packages 200Bu and 200Bv on the back. Each package 200 is as described in connection with FIGS. 2 and 3A. The front view of FIG. 4 illustrates both the package control and package data connections; the side view omits the control connections.

Module 400 includes a module connector 410 and an address buffer component 415. (Buffer component 415 is sometimes called a Registering Clock Driver, or RCD.) Module connector 410 provides external connectivity to a set of primary data connections 420 and primary control connections 425. Data connections 420 connect the package data interface of each of DRAM collections 405[8:0] to a corresponding pair of link groups DQu/DQv, each link group conveying four bits of data DQ and a differential strobe DQS±. Control connections 425 connect buffer component 415 to a primary command/address link group DCA and primary control link group DCTRL. As detailed below, buffer component 415 interprets command, address, and control signals on connections 425 to create and issue secondary command, address, and control signals to DRAM collections 405[8:0] via secondary link groups CAxa and CAxb. As used herein, a "link" is a conductor that provides a unidirectional or bidirectional communication between source and destination circuits, and a "link group" is a collection of links that communicates between source and destination circuits in parallel.

With reference to DRAM collection 405[4]—the others are identical—nibble DQu is coupled to input port DQa of the left front-side package 200Au, and nibble DQv is coupled to input port DQa of the right front-side package 200Av. The internal interconnectivity for each package 200 is as illustrated in FIGS. 1 and 2. All four packages 200 can be written to and read from via either of nibbles DQu and DQv. When both ports DQu and DQv are in a full-width mode, data to and from packages 200Bu and 200Bv traverses respective packages 200Au and 200Av, which impose additional write and read delays. Delay elements 120 (FIG. 1) packages 200Au and 200Av can insert delays that normalize the latencies for memory transactions to the different packages.

FIG. 5A depicts one of DRAM collections 405[8:0] of FIG. 4 to highlight connectivity between and among the constituent packages 200 and components 100. (Element designations omitting a suffix—e.g. 405 in lieu of 405[5] or 100 in lieu of 100a—reference a class of elements rather than a specific instance.) A vertical front/back line in the center shows that the two left stacks are on the front side of the module substrate and the two right stacks are on the back side of the module substrate. Packages 200Au and 200Bu connect to the CAxa command/address links, and packages 200Av and 200Bv connect to the CAxb command/address links.

The primary DQu links connect to the upper front side package 200Au using a P-to-P connection (the DQa port of the top DRAM component 100a). Ports DQc and DQbd of package 200Au are coupled to ports DQbd on respective packages 200Av and 200Bu. The primary DQv links from the module connector connect to the lower front side package 200Av using a P-to-P connection (the DQa port of the top DRAM component 100a). Port DQc of package 200Av is coupled to port DQbd of package 200Bv. Finally, ports DQa and DQc of package 200Bu are coupled to respective ports on package 200Bv.

In this configuration, each data network is loaded by as many as four DRAM components 100 (e.g., network 200Au-200Bu DQbd connects to four components 100); however, the physical distance between interconnected ports can be made quite short (e.g., on the order of a few millimeters). The data networks between the module connector and each package 200, link groups DQu and DQv, are longer—e.g. on the order of a centimeter—but are loaded by fewer DRAM components 100. As a result, the signaling rate between the connector and packages 200 can approximate the rates between DRAM components 100. These signaling rates, in turn, can be matched to the signaling rate of the data connections between the module and an external controller component or an external module (on the order of ten centimeters in length).

Collection 405 can be configured to communicate nibble-wide data via port DQu, or byte-wide (eight bit) data via ports DQu and DQv. All four DRAM components 100 are accessible in either configuration, with the narrow configuration offering double the number of address locations. The different configurations route data through different numbers of components, and thus introduce different read and write delays.

Figure 5B:
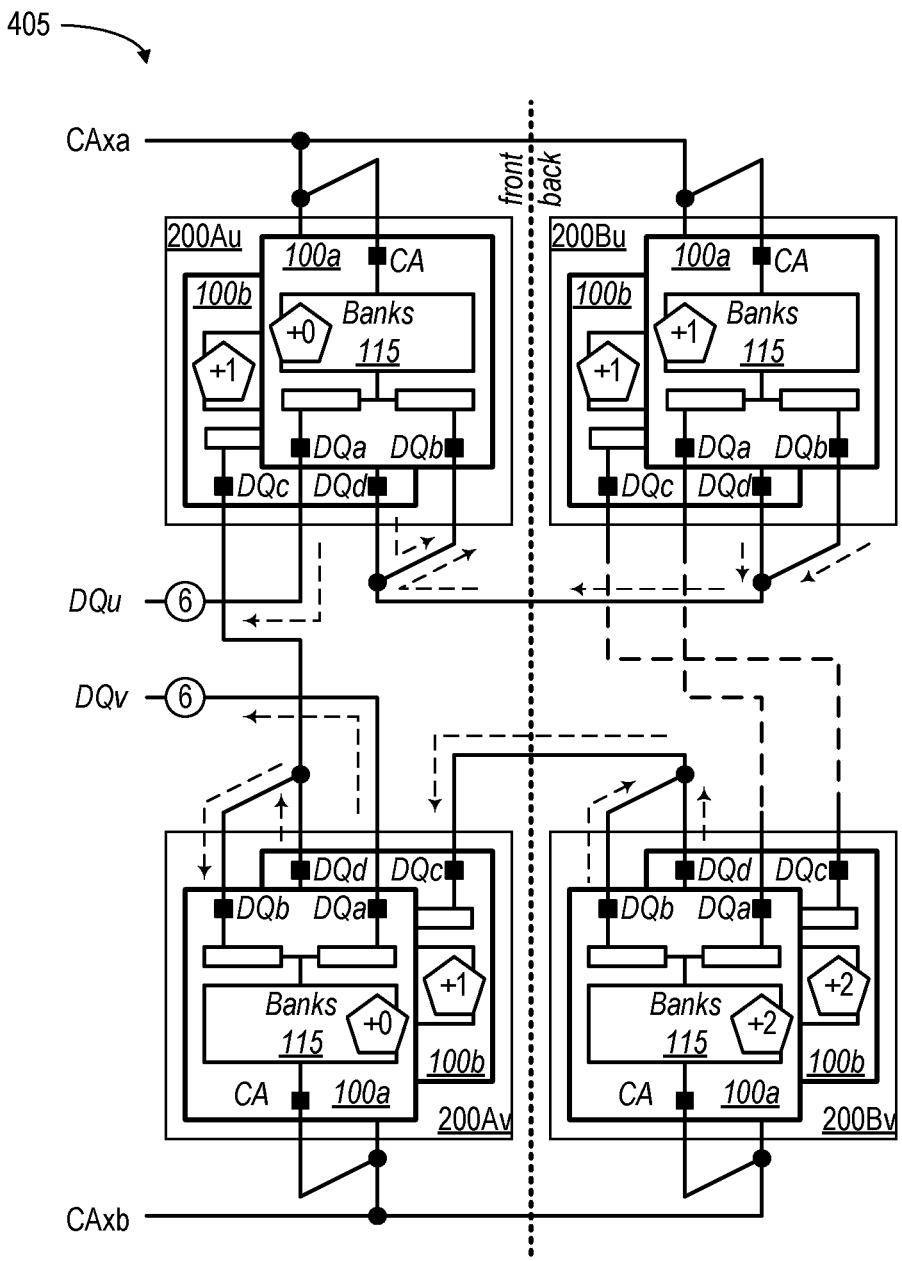
FIG. 5B depicts DRAM collection 405 of FIGS. 4 and 5A, illustrating how read data flows through components 100 in a full-width (byte-wide) configuration.

FIG. 5B depicts DRAM collection 405 of FIGS. 4 and 5A, illustrating how read data flows through components 100 in a full-width (byte-wide) configuration. Dotted arrows show the movement of data for a column read operation. The data movement would be reversed for a write operation. Numbered pentagons show the numbers of incremental transfers used to move the read data from a selected DRAM component 100 to one of DQ link groups DQu and DQv. In this example, the transfer delay value (to retransmit between the DQa port and DQb port) is approximately three clock cycles (e.g. about one nanosecond). This timing budget provides one cycle for serialization latency (two data bits per clock cycle) plus two additional clock cycles for clock skew between the two DRAM packages (±1 clock cycle). The transfer delay value is comparable to the transfer delay encountered in a module which employs TSV/3DS stacking technology (with a secondary DQ bus to the stacked DRAMs), or in a module which employs data buffer components (an LRDIMM module). In both cases, the data will be received and retransmitted with a timing budget comparable to what is described above. In essence, two independent accesses are performed in parallel, with packages 200Au and 200Bu part of one memory sub-space, and packages 200Av and 200Bv the other. The link groups between packages 200Bu and 200Bv are not used in this configuration. The transfer delay values can be different in other embodiments.

DRAM components 100a of each package 200Au and 200Av are accessed directly, and thus have an incremental transport latency of +0. In a typical system, these components would add +2 additional internal delay—by configuring delay element 120—to match the worst-case transport delay of the other components. The remaining DRAM components 100 are accessed via one or more other components 100, and thus have incremental transport latencies as shown. Package 200Bv, for example, communicates with primary link group DQv via both components 100a and 100b in package 200Av, and thus establishes the worst-case +2 transport latency for DRAM collection 405. Delay elements 120 in the various DRAM components 100 are configured to match the access latencies for each component 100.

Figure 5C:
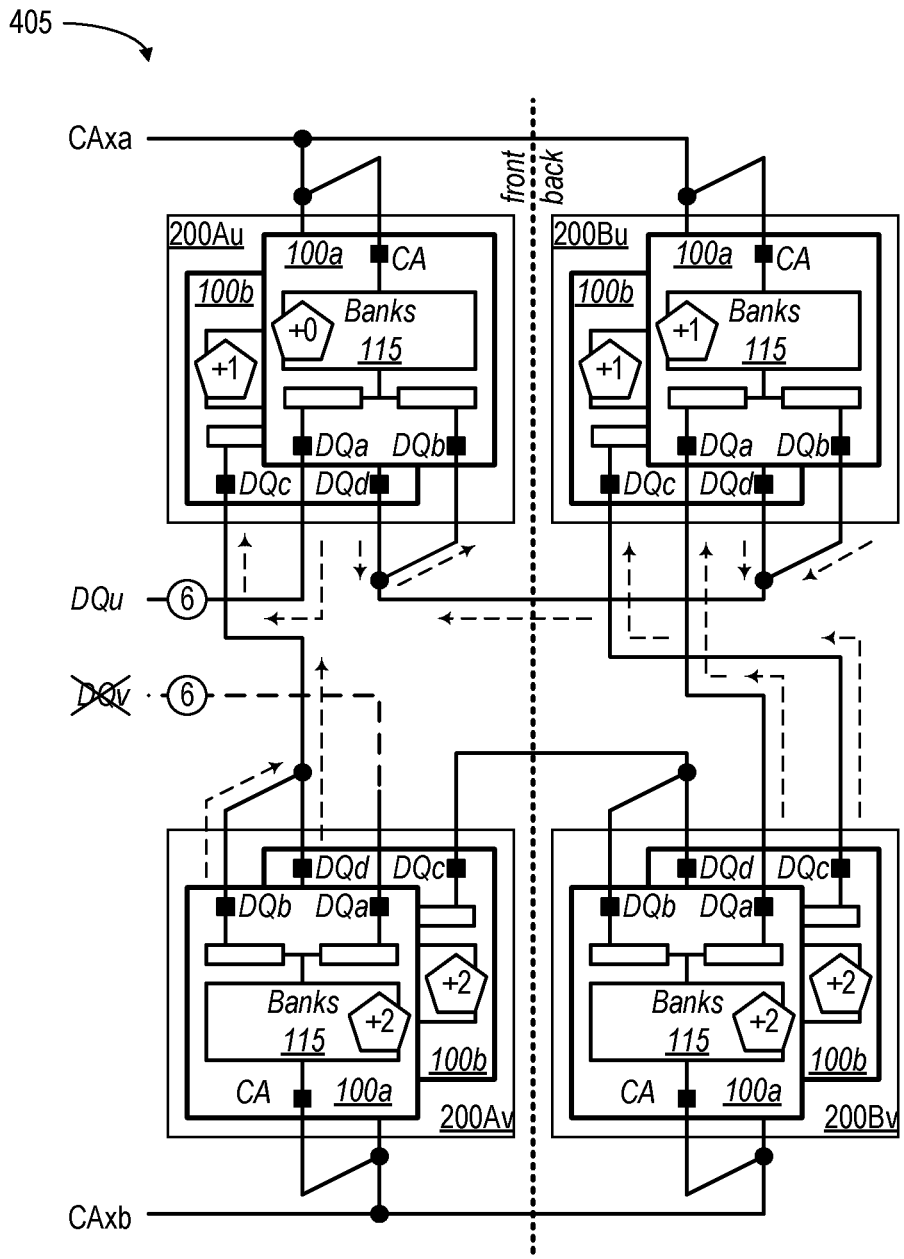
FIG. 5C depicts DRAM collection 405 of FIGS. 4, 5A, and 5B illustrating how read data flows through components 100 in a narrow (nibble-wide) configuration.

FIG. 5C depicts DRAM collection 405 of FIGS. 4, 5A, and 5B illustrating how read data flows through components 100 in a narrow (nibble-wide) configuration. Dotted arrows show the movement of data for a column read operation. All data is communicated through primary link group DQu in this configuration; link group DQv is not used. Numbered pentagons show the numbers of incremental transfers used to move the read data from a selected DRAM component 100 to link groups DQu. As in the full-width configuration of FIG. 5D, the worst-case incremental transport latency is +2. Delay elements 120 in the various DRAM components 100 are configured to match the access latencies for each component 100. The data movement would be reversed for a write operation.

Figure 5D:
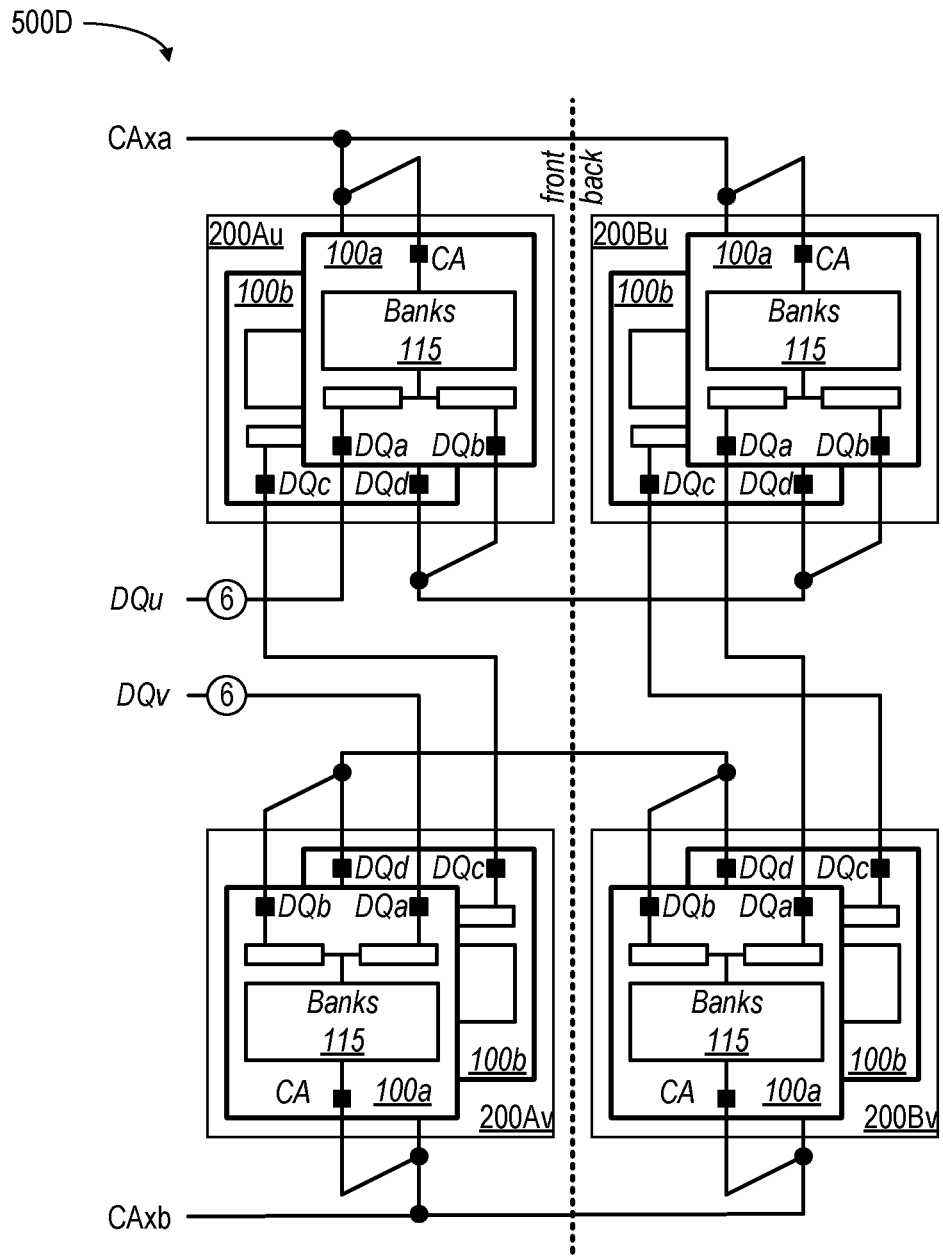
FIGS. 5D, 5E, and 5F depict respective DRAM collection 500D, 500E, and 500F.
Figure 5E:
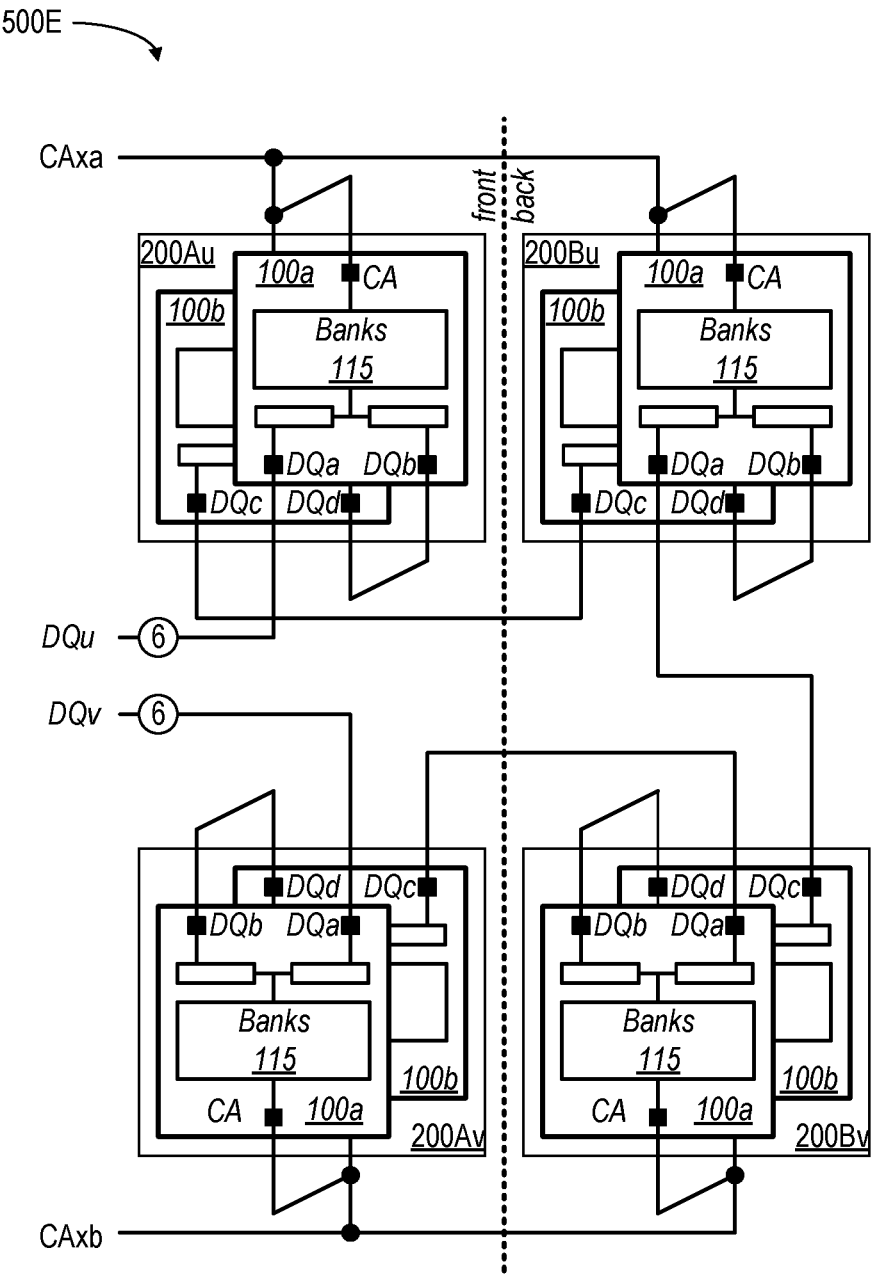
Figure 5F:
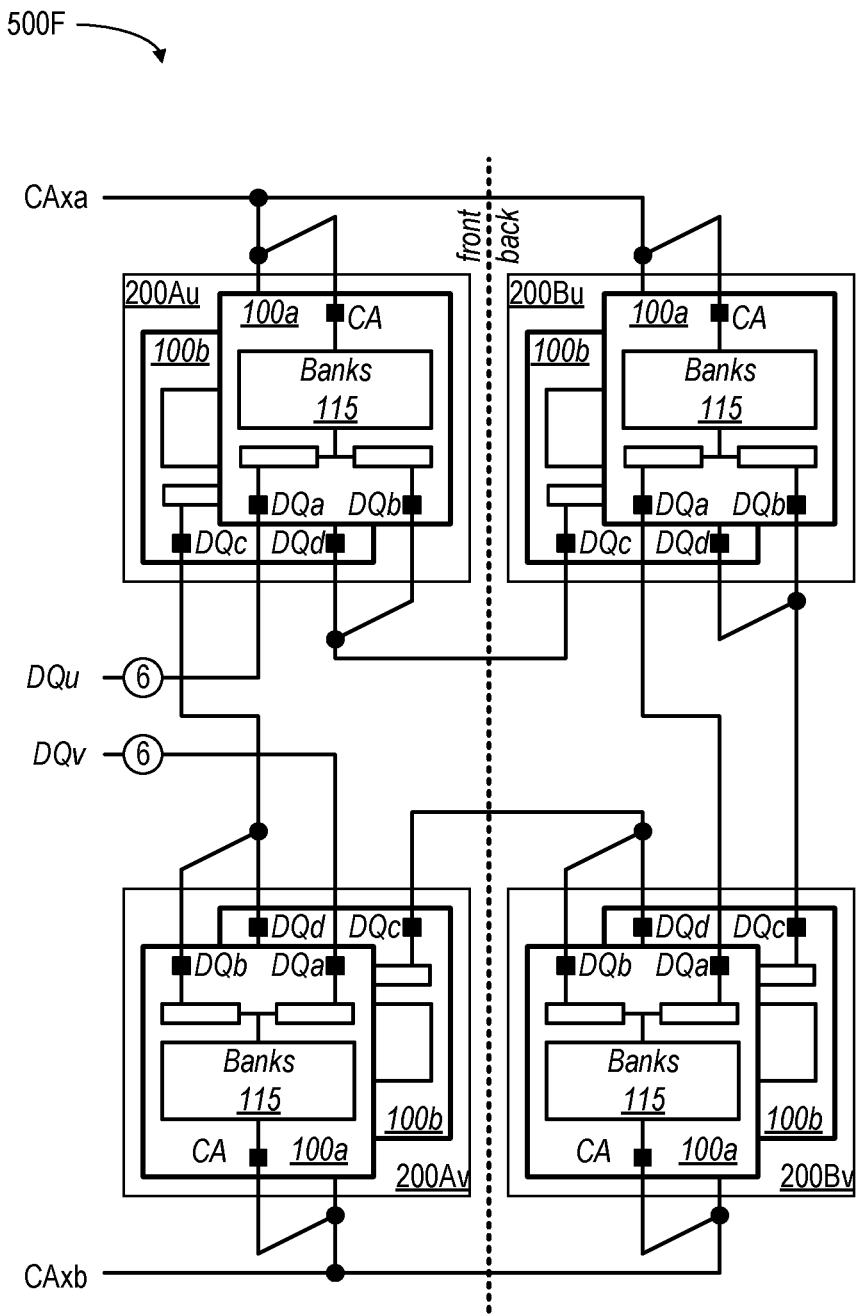

FIGS. 5D, 5E, and 5F depict respective DRAM collection 500D, 500E, and 500F. Each of the collections is similar to collection 405 of FIG. 5A-5C, but has different connectivities for the constituent DRAM components 100.

Figure 6A:
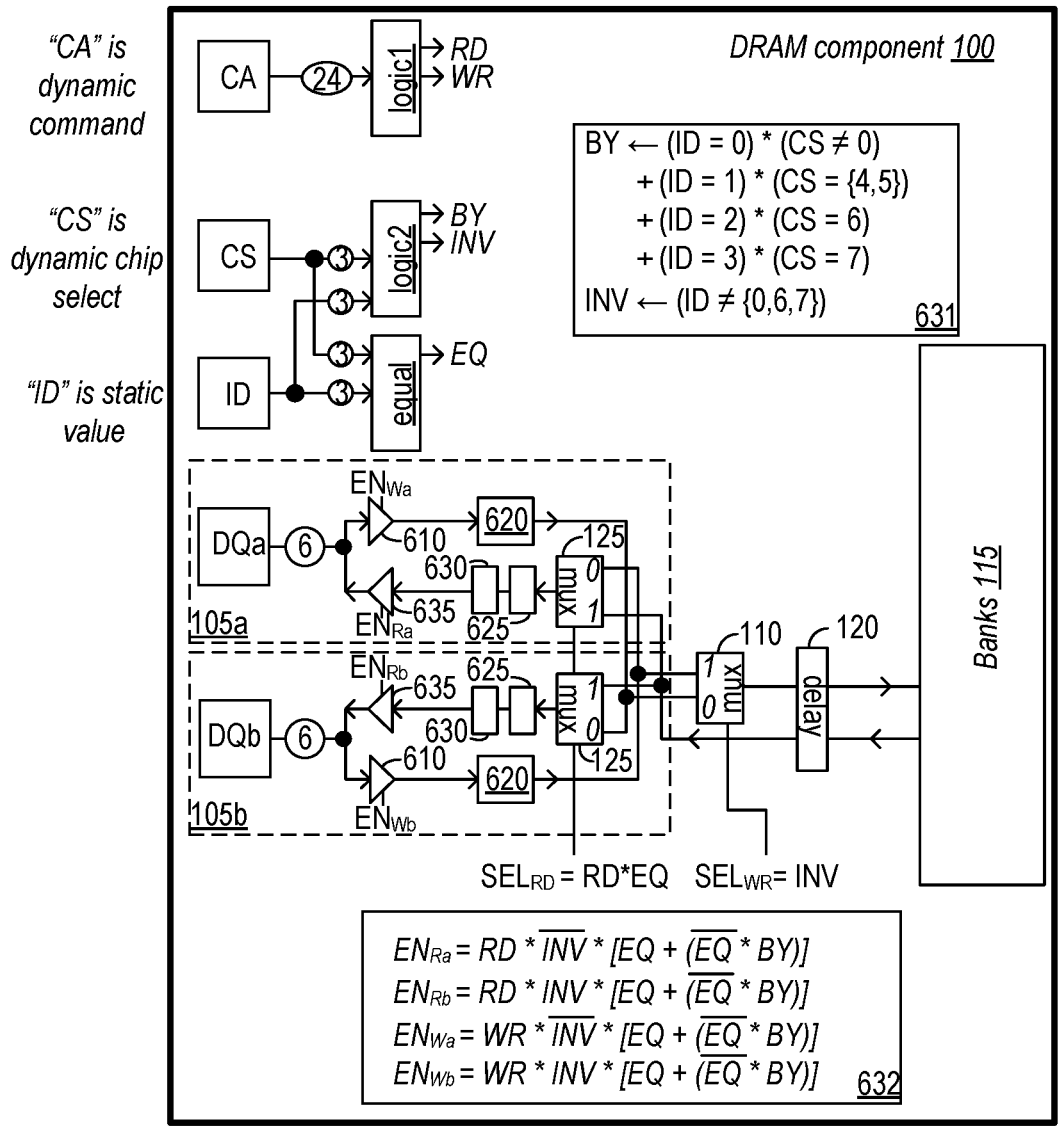
FIG. 6A details the control logic in an embodiment of DRAM component 100 used to steer data in e.g. the eight DRAM components 100 in each of packages 405[8:0] of FIGS. 4 and 5A.

FIG. 6A details the control logic in an embodiment of DRAM component 100 used to steer data in e.g. the eight DRAM components 100 in each of packages 405[8:0] of FIGS. 4 and 5A. Each interface 105a and 105b serves as a data transceiver to convey write and read data to and from banks 115, and to and from one another. To this end, each interface includes multiplexer 125 introduced in FIG. 1 to allow interfaces 105a and 105b alternative access to one another or to DRAM banks 115. Each interface additionally includes an input amplifier 610, a sampler 620, a phase-adjustment circuit 625, a clock-cycle adjustment circuit 630, and a transmitter 635.

Component 100 has a static ID value that indicates the region of the memory space that it contains. The ID value can be set with hardwired pins, or with internal control register fields, or with some equivalent method. The static value will be set at e.g. initialization time, and need not change.

Component 100 receives dynamic command and address information (CA) and chip-selection information (CS), which changes for each column access operation and row access operation. In this context, "dynamic" refers to the fact that the CA and/or the CS information from the memory controller changes on a per-command basis. The CS selection information can be encoded or decoded (the example in the figure shows the CS and ID as encoded values). The data steering control logic responds to the column commands (e.g. read RD and write WR). For components with stacked die, one die is selected to perform the column access by comparing a dynamic CS selection value and the static ID value. If they are equal, a signal EQ is asserted, indicating that a read or write access will be made to this DRAM component 100. Additional selection occurs by comparing the dynamic CS selection value and the static ID value in a block logic2.

If component 100 is not being accessed, but will need to assist in transporting the column data, block logic2 asserts a signal BY. Logic logic2 also generates a signal INV to control the direction of the data transport operation. Signals RD, WR, EQ, BY, and INV are used to enable the transmit and receive logic for the DQa and DQb data ports of the DRAM (the ENwa, ENra, ENwb, and ENrb control signals). Signals RD, WR, EQ, BY, and INV are also used to enable the internal multiplexing logic between the DQa and DQb data ports and the storage banks of the DRAM (the SELrd and SELwr control signals). Logic blocks 631 and 632 depict the logical derivation of the various control signals.

The control logic of FIG. 6A can be implemented with a few dozen gates, and will not significantly impact the area or timing of the DRAM interface. Though not shown, a second set of control logic can be included to support the narrow-width configuration illustrated in FIG. 5B. This option would add a few dozen additional gates.

Figure 6B:
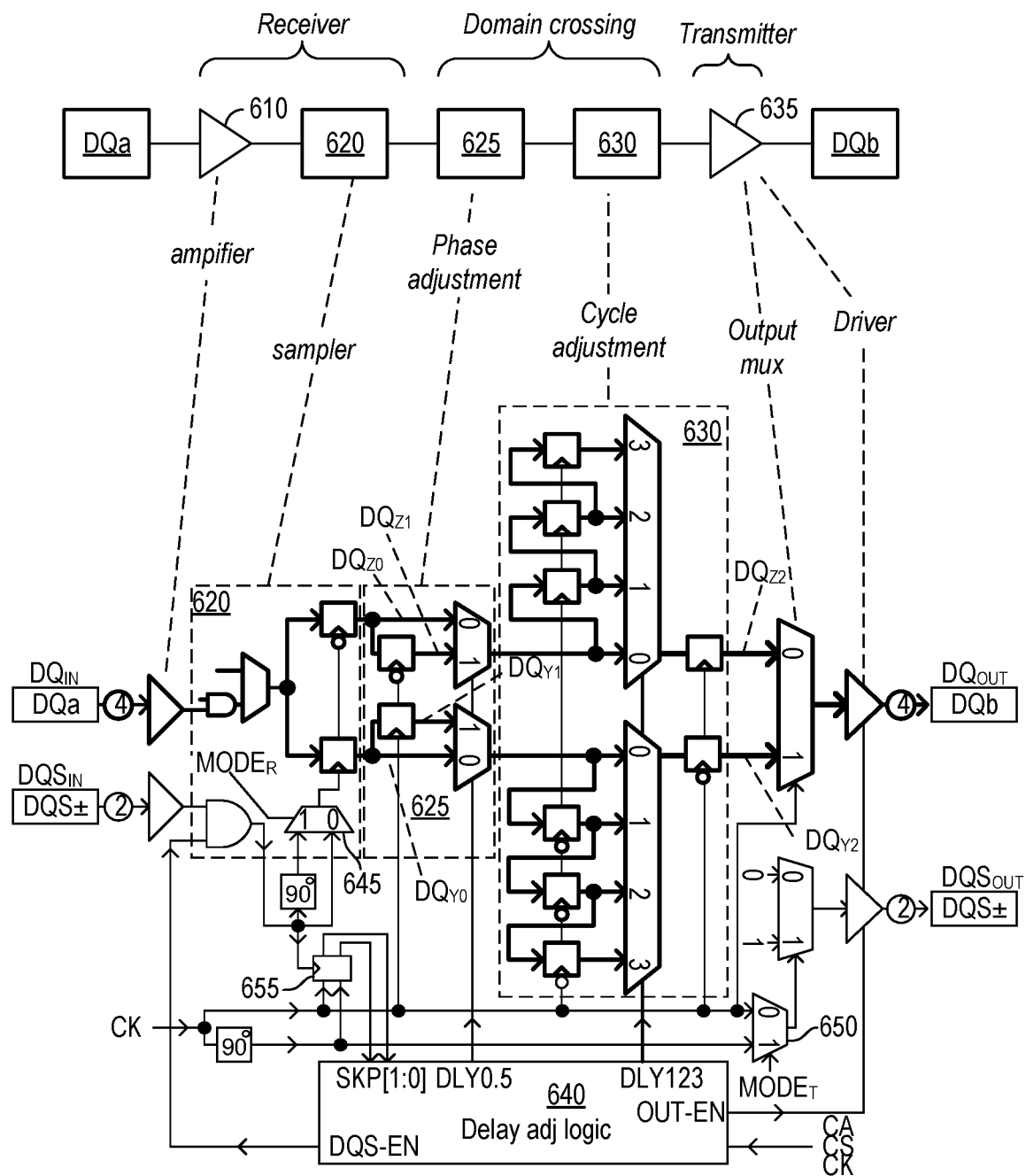
FIG. 6B is a diagram 650 depicting elements of interfaces 105$a$ and 105$b$ that establish a communication path from port DQa to port DQb.

FIG. 6B is a diagram 650 depicting elements of interfaces 105a and 105b that establish a communication path from port DQa to port DQb. A similar path extends in the opposite direction, as depicted in FIG. 6A. Ports DQa/DQb are alternatively labeled $DQ_{IN}$ and $DQ_{OUT}$ to reflect the direction of signal flow for this example. Strobe ports DQS± on either side are similarly labeled $DQS_{IN}$ and $DQS_{OUT}$.

Much of the circuitry of diagram 650 operates in a clock domain timed to a clock signal CK that accompanies the CA signals. The receiver portion, which includes amplifier 610 and sampler 620, operates in the domain of the received strobe $DQS_{IN}$. A pair of multiplexers 645 and 650 with selector inputs $MODE_R$ and $MODE_T$ driven from e.g. control register fields selectively introduce a ninety-degree phase shift to adjust the phase relationships between the data and strobe signals for both receive and transmit blocks. Delay adjustment logic 640 performs the domain-crossing function between the domain of the receiver and the one timed to clock signal CK. Logic 640 generates a signal DQS-EN that establishes an enable window for the strobe signal in the CK clock domain upon receipt of a read or write command.

A sampler 655 samples the undelayed and 90° delayed clock signal CK by the strobe signal $DQS_{IN}$, and the resulting values SKP[1:0] determine how to adjust the DLY0.5 phase value and DLY123 1 cycle value from their initial value. This determination is performed e.g. on every data transfer to allow 0 to 4 TCK of misalignment between signals $DQS_{IN}$ and CK to be automatically compensated. A pair of multiplexers in transmitter 635 selectively insert a zero or ninety degree phase shift in the strobe signal DQS on the transmit side. An output-enable signal OUT-EN from logic 640 produces an enable window for the output driver of transmitter 635 upon receipt of a read or write command.

Figure 6C:
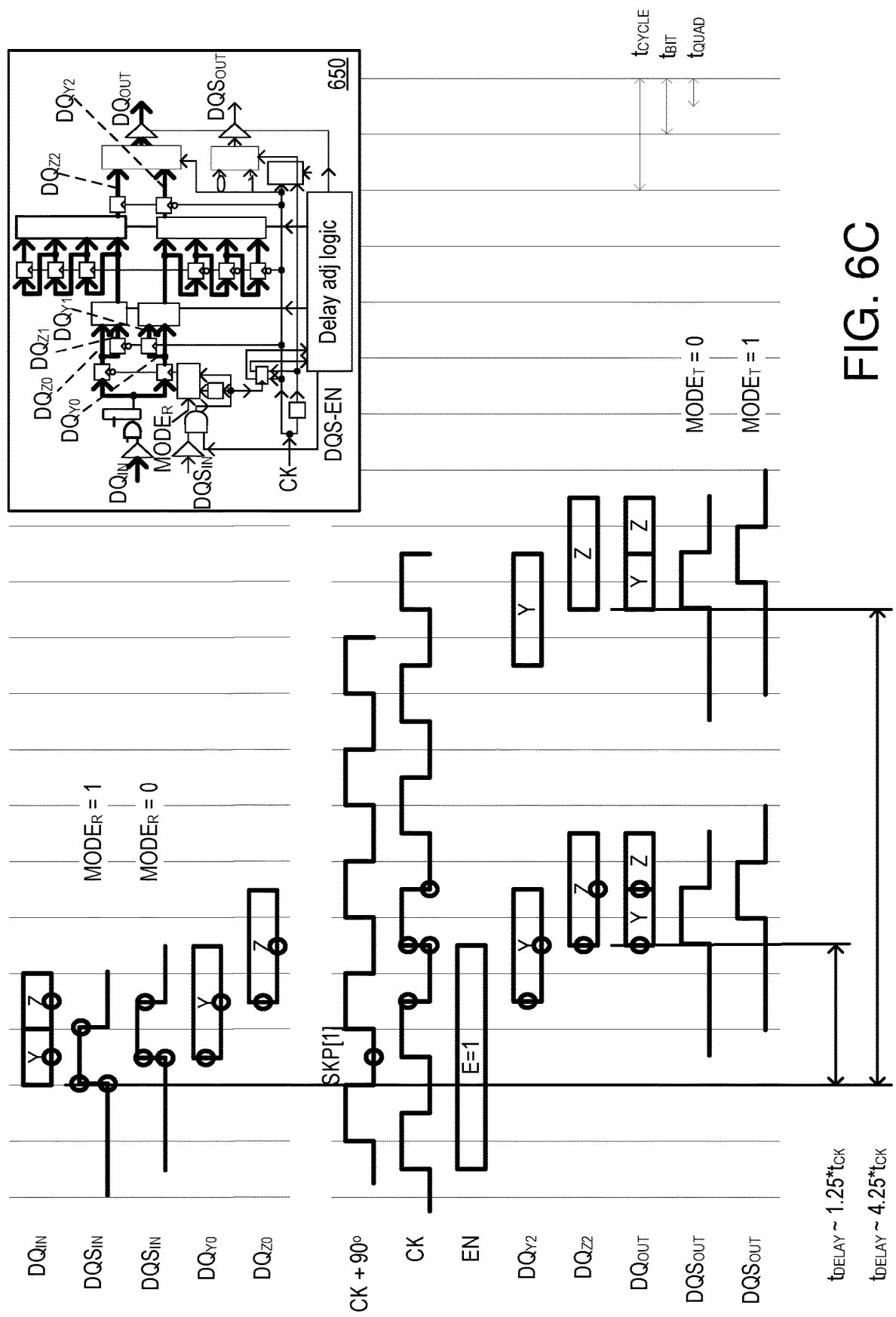
FIG. 6C shows the timing relationship of elements of diagram 650 of FIG. 6B.

FIG. 6C shows the timing relationship of elements of diagram 650 of FIG. 6B. Diagram 650 is reproduced at the upper right to identify circuit nodes with signal names. (In general, signal names and their respective nodes are referred to using the same designation. Whether a given reference is to a node, port, link, or signal name will be clear in context.) The top set of waveforms show the $DQ_{IN}$ and $DQS_{IN}$ timing relationship for the receive domain. When $MODE_R$ is one, $DQS_{IN}$ is edge-aligned; $DQS_{IN}$ and $DQ_{IN}$ make transitions which are approximately aligned (in-phase).

When $MODE_R$ is zero, $DQS_{IN}$ is center-aligned; $DQS_{IN}$ and $DQ_{IN}$ make transitions that are not aligned (out-of-phase). The misalignment is approximately 90°, meaning that $DQS_{IN}$ transitions are approximately midway between the $DQ_{IN}$ transitions. The component interface can receive data with either phase alignment. The center alignment is typically used for write data, and the edge alignment is typically used for read data. The DRAM component will transfer either read or write data from one interface to the other for some of the system configurations.

The bottom set of waveforms show the $DQ_{OUT}$ and $DQS_{OUT}$ timing relationship for the transmit domain. When $MODE_T$ is zero, strobe signal $DQS_{OUT}$ is edge-aligned; signals $DQS_{OUT}$ and $DQ_{OUT}$ make transitions that are approximately in-phase. When $MODE_T$ is one, $DQS_{OUT}$ is center-aligned; $DQS_{OUT}$ and $DQ_{OUT}$ make transitions that are misaligned by about 90°, meaning that $DQS_{OUT}$ transitions are approximately midway between the $DQ_{OUT}$ transitions.

The DRAM interface transmits data with either phase alignment. The center alignment is used for write data, and the edge alignment is used for read data. The DRAM transfers either read or write data from one interface to the other for some of the system configurations, so this modal configurability is needed.

Figure 6D:
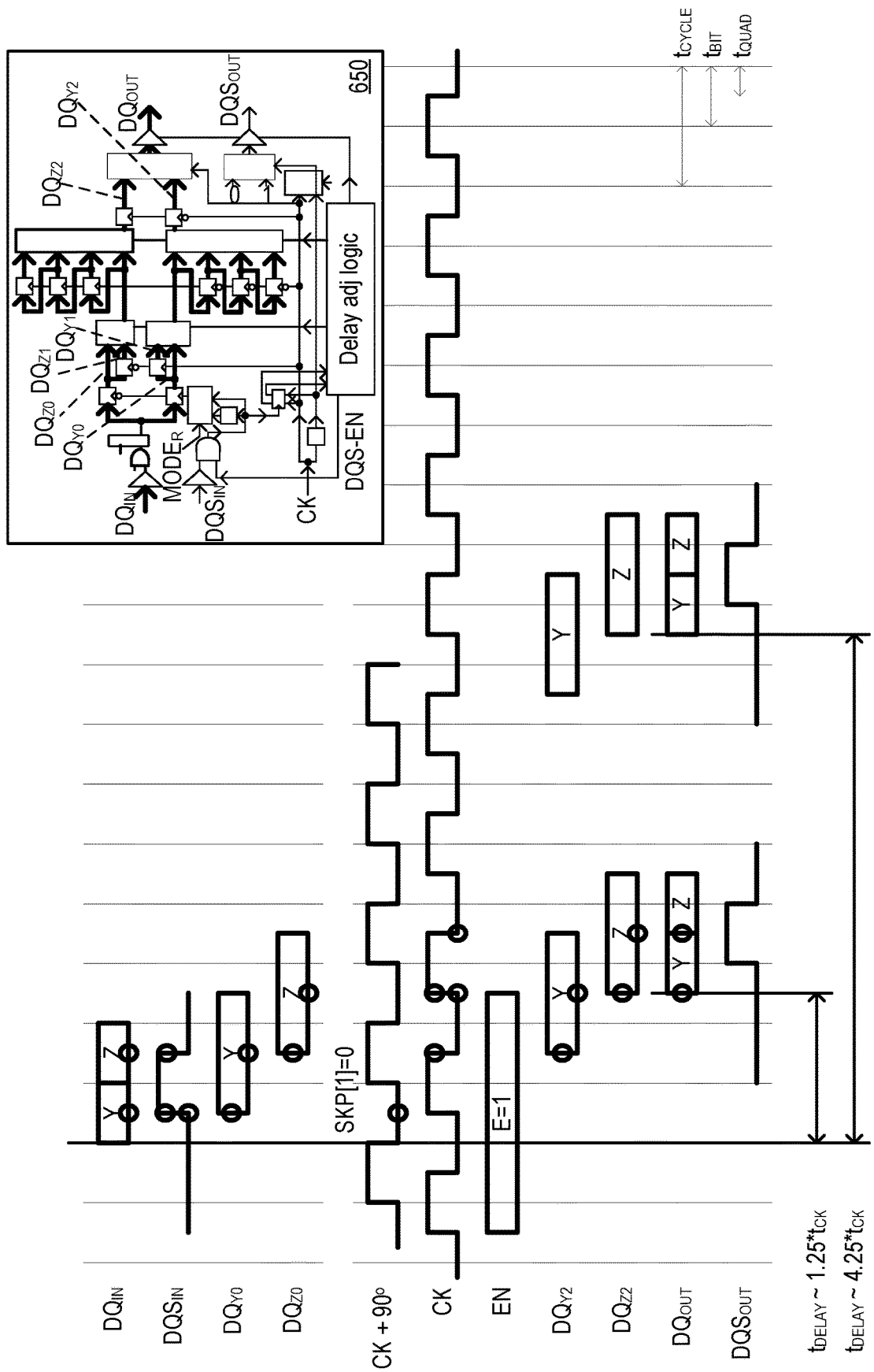
FIG. 6D shows the second order detail of the domain-crossing logic for the circuitry 650 of FIG. 6B, which is again reproduced in to the upper right for ease of review.

FIG. 6D shows the second order detail of the domain-crossing logic for the circuitry of diagram 650 of FIG. 6B. The logic in this example has had control register fields (not shown) set to specific values to illustrate how the interface could be initially configured and maintained. Primary data signals $DQ_{IN}$ (the receive domain) is sampled by the primary timing link $DQS_{IN}$ at the rising and falling edges (because $MODE_R=0$, inserting zero degrees of delay into the DQS path). This results in two sampled values Y and Z held on the $DQ_{Y0}$ and $DQ_{Z0}$ register outputs in the DQS domain. Signal DQS-EN is formed in the CK domain and gates the $DQS_{IN}$ signal, and can be extended if the data transfer is longer.

This example assumes the DQS and CK signals are aligned so the SKP[1] value sampled from CK+90° by $DQS_{IN}$ is LOW. The DLY0.5 control value was set by the SKP[1] value on the previous WR transfer, so it will also be low. The low value on the DLY0.5 control causes the $DQ_{Y0}$ and $DQ_{Z0}$ values to be passed through the multiplexers in the phase adjustment block.

The value on the DLY123[1:0] control is assumed to be 00, which causes the $DQ_{Y0}$ and $DQ_{Z0}$ values to be passed through the multiplexers in cycle adjustment block 630, as well. The $DQ_{Y0}$ and $DQ_{Z0}$ values will be sampled by the $DQ_{Y2}$ and $DQ_{Z2}$ registers and will have crossed into the CK domain at this point. The $DQ_{Y2}$ and $DQ_{Z2}$ registers drive the output multiplexer, which in turn drives the output driver for data port DQb.

Logic 640 produces strobe output $DQS_{OUT}$, which is driven using the CK+90° signal when the $MODE_T=1$ value causes 90 degrees of delay to be inserted to the $DQS_{OUT}$ value. If the value on the DLY123[1:0] control is assumed to be 11, the $DQ_{Y0}$ and $DQ_{Z0}$ values will be delayed by a three-cycle pipeline. The data and timing signals will appear on the secondary links 3*tCK later than for the previous case. This allows the delay through the DQS-to-CK domain crossing to be adjusted in one-cycle increments.

Figure 6E:
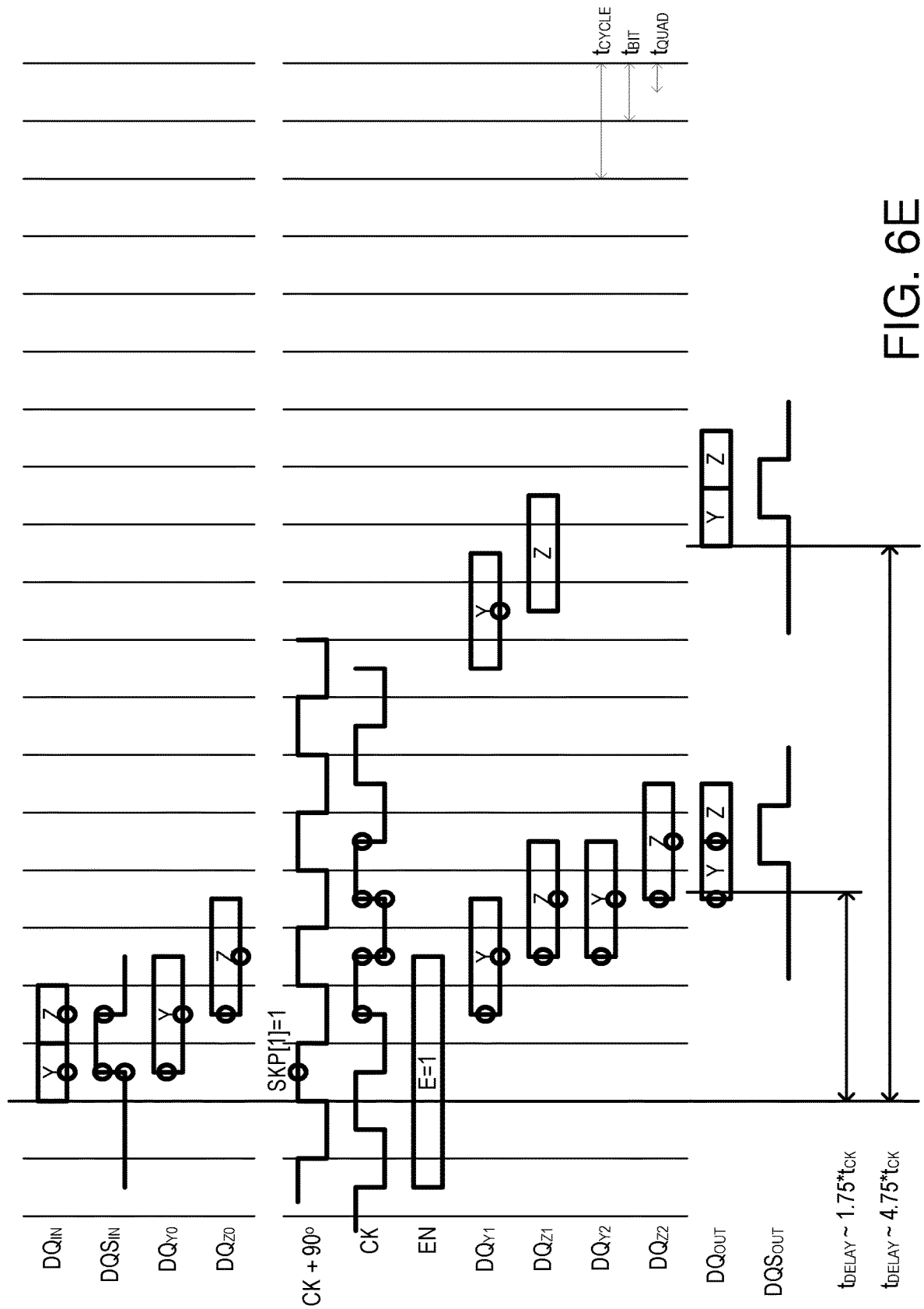
FIG. 6E is similar to FIG. 6D, except that it assumes the $DQS_{IN}$ and CK signals are not aligned so the SKP[1] value sampled from CK+90° by $DQS_{IN}$ is high.

FIG. 6E is similar to FIG. 6D, except that it assumes the $DQS_{IN}$ and CK signals are not aligned so the SKP[1] value sampled from CK+90° by $DQS_{IN}$ is high. The waveforms of six internal nodes are shown in the figure, along the primary data input and secondary data output signals. Each primary data link $DQ_{IN}$ is sampled by the primary timing link $DQS_{IN}$ at the rising and falling edges, resulting in two sampled values Y and Z held on the $DQ_{Y0}$ and $DQ_{Z0}$ register outputs in the $DQS_{IN}$ domain. The DQS-EN signal is formed in the CK domain and gates the $DQS_{IN}$ signal. It will be extended if the data transfer is longer.

A high value on the DLY0.5 control causes the $DQ_{Y0}$ and $DQ_{Z0}$ values to be sampled by the $DQ_{Y1}$ and $DQ_{Z1}$ registers and passed through the multiplexers in the phase adjustment block. The value on the DLY123[1:0] control is assumed to be 00, which causes the $DQ_{Y1}$ and $DQ_{Z1}$ values to be passed through the multiplexers in the cycle adjustment block. The $DQ_{Y1}$ and $DQ_{Z1}$ values will be sampled by the $DQ_{Y2}$ and $DQ_{Z2}$ registers and will have crossed into the CK domain at this point. The $DQ_{Y2}$ and $DQ_{Z2}$ registers drive the output multiplexer, which in turn drives the output driver for the secondary link group.

Signal $DQS_{OUT}$ is enabled by signal OUT-EN from logic 640, and is driven using the CK+90° signal, since the $MODE_T$=1. If the value on the DLY123[1:0] control is assumed to be 11, the $DQ_{Y0}$ and $DQ_{Z0}$ values will be delayed by a three-cycle pipeline. The data and timing signals appear on the secondary links 3*tCK later than for the previous case. This allows the delay through the DQS-to-CK domain crossing to be adjusted in one-cycle increments.

Figure 6F:
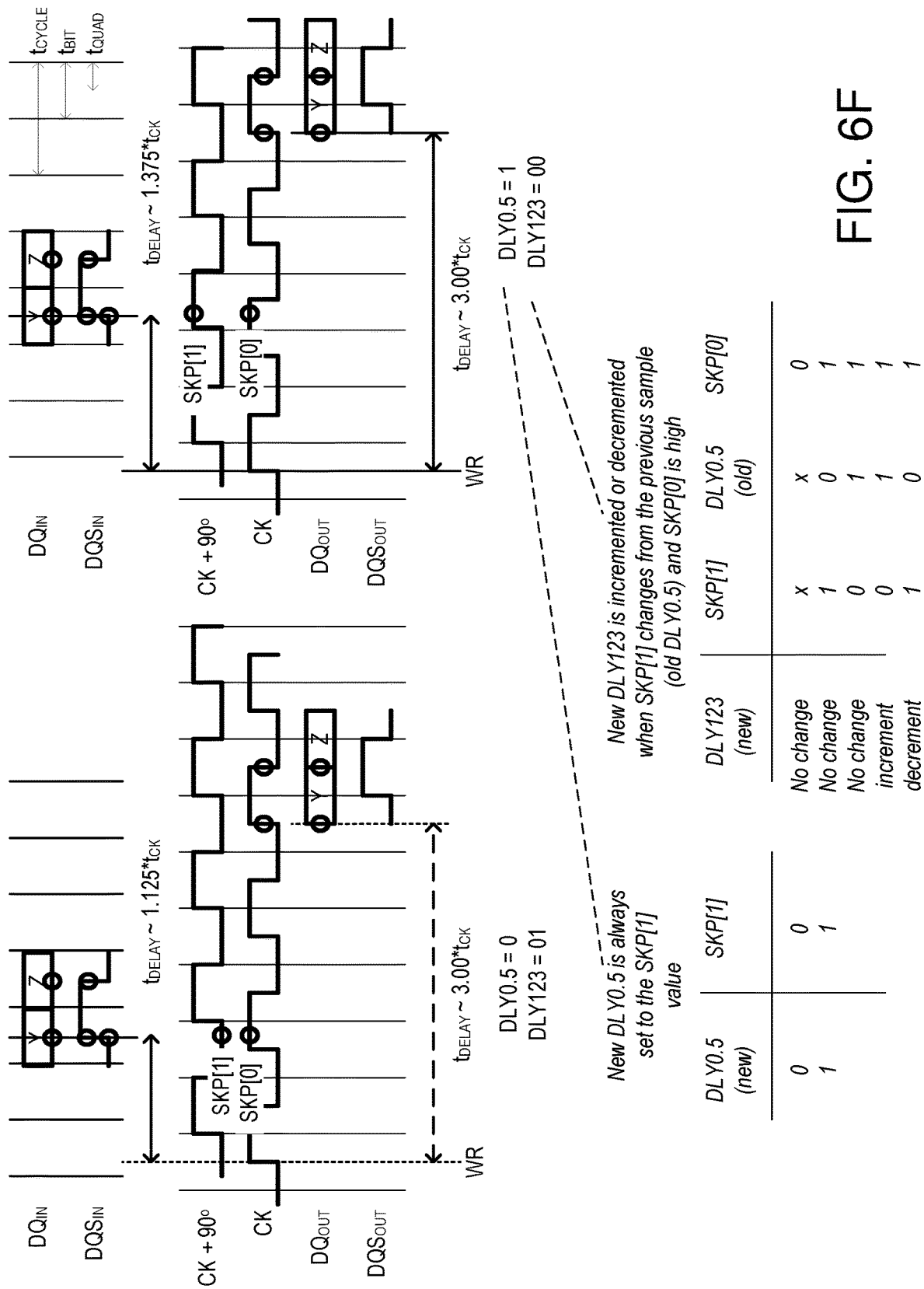
FIG. 6F is a waveform diagram illustrating how the timing examples of FIGS. 6D and 6E can be combined to automatically track drift between the $DQSI_N$ and CK domain over an arbitrarily large range.

FIG. 6F is a waveform diagram illustrating how the timing examples of FIGS. 6D and 6E can be combined to automatically track drift between the $DQSI_N$ and CK domain over an arbitrarily large range. This example assumes that the domain-crossing logic has been initialized so the delay from a column write command on the CA bus and the write data for that command is a constant 3.00*tCK (these values are smaller than would be seen in an actual system so they will fit in the timing diagram more easily).

In the left diagram, the write strobe arrives 1.125*tCK after the write command. The SKP[1:0] values that are sampled are "01". The new DLY0.5 phase value is set from SKP[1], and the new DLY123[1:0] cycle value is "01" (the same as what was previously set at initialization). In the right diagram, the $DQS_{IN}$ timing has drifted relative to the CK domain, so the write strobe arrives 1.375*tCK after the write command. The SKP[1:0] values that are sampled are "11".

The new DLY0.5 phase value is set from SKP[1]. Because the SKP[1] and the old DLY0.5 phase value are different, and because SKP[0] is high, the new DLY123[1:0] will increment or decrement (relative to old DLY123[1:0] value) to keep the command-to-data delay constant at 3.00 tCK (it will decrement in this example). In summary, the $DQS_{IN}$ timing signal for each transfer will sample the CK and CK+90° (in the case of a write) and retain this information in the SKP[1:0] register.

At the idle interval before the next transfer, the DLY0.5 and DLY123[1:0] values (held in a control register in the CK domain) can be updated to reflect the SKP[1:0] from the previous transfer. These new DLY0.5 and DLY123[1:0] values are used on the next transfer. This sequence will happen automatically on each transfer, and will allow the domain-crossing logic to accommodate an arbitrarily large range of DQS-to-CK drift during system operation.

After an initialization process gets the control registers set to appropriate values, no further maintenance operations are required to support this automatic tracking.

Figure 7A:
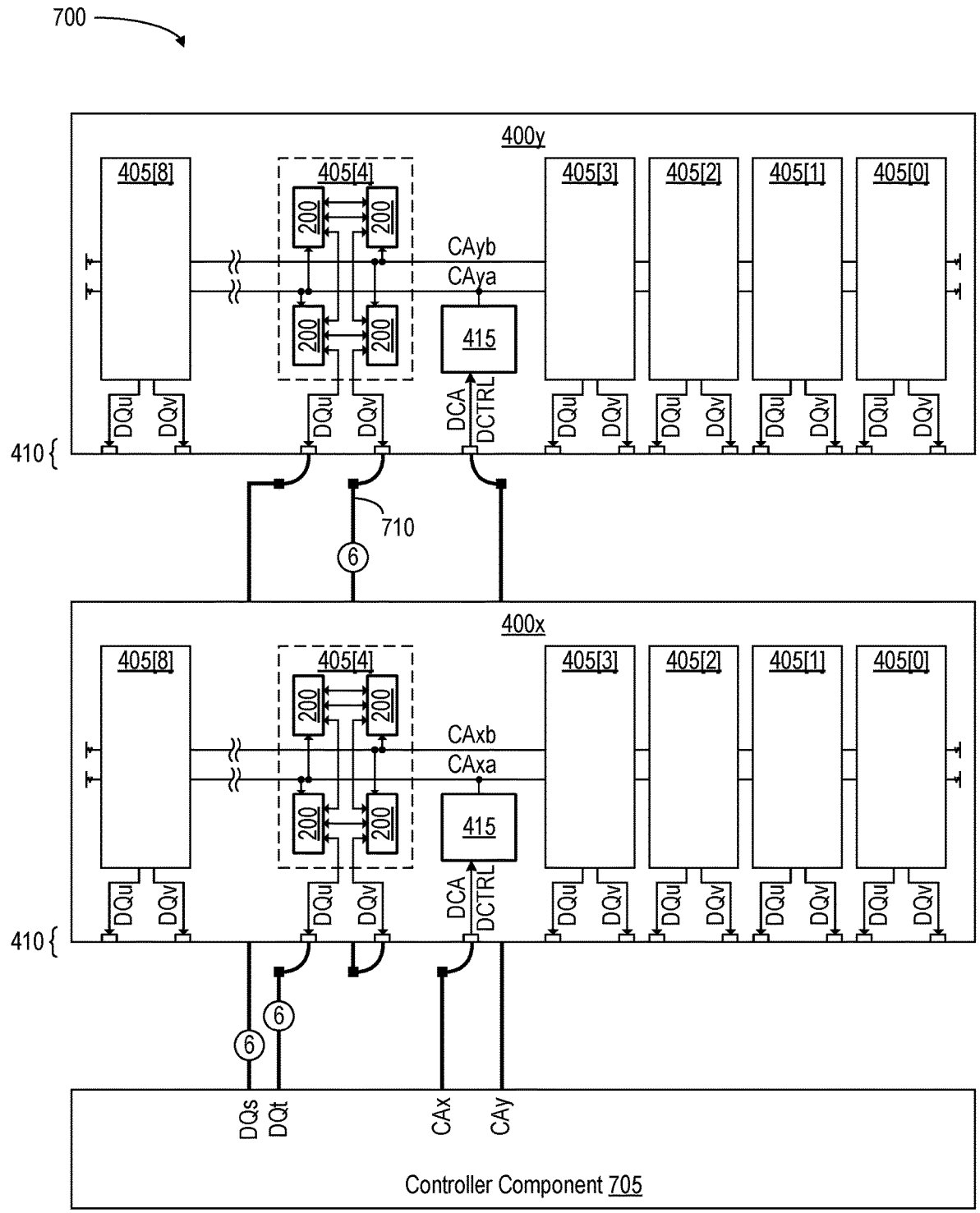
FIG. 7A depicts a memory system 700 with two modules 400$x$ and 400$y$, each configured in the half-width (nibble-wide) mode of FIG. 5B, coupled to a common controller component 705.

FIG. 7A depicts a memory system 700 with two modules 400x and 400y, each configured in the half-width (nibble-wide) mode of FIG. 5B, coupled to a common controller component 705. The "nibble" width refers to each of nine collections of DRAM packages 200, making the module data width 36 (9×4) bits in this example. Memory system 720 provides P-to-P data connections between controller component 705 and both modules 400x and 400y, for a controller data with of 72 bits. As noted previously, the data link groups are shown to be of width six because they include two strobe lines DQS± (not shown) to convey a differential strobe signal with each data nibble.

Controller component 705 includes a pair of redundant control ports CAx and CAy, each of which extends to a corresponding module socket. In this two-module embodiment, control port CAx (CAy) extends to module 400x (400y). Identical control signals can be conveyed via control ports CAx and CAy, with modules 400x and 400y developing different secondary control signals CAxa/CAxb and CAya/CAyb to control their respective memory resources. Alternatively, control ports CAx and CAy can provide different signals (e.g., separate CS and CA signals). Controller component 705 additionally includes a controller data interface with nine pairs of nibble-wide data ports DQs/DQt, only one of which is shown. In each pair, port DQs extends to the far connector and port DQt to the near. Nine link groups 710—one of which is shown—extend between the module connectors, but are not used in this two-module configuration. Controller component 705 can communicate with any DRAM package 200 in each of collections 405[8:0] in the uppermost module 400y via link group DQs and with any DRAM package 200 in the lowermost module 400x via link group DQt.

As discussed above in connection with FIGS. 1 and 2, each package 200 can include multiple DRAM components 100, and each component 100 can include stacked DRAM die. In one embodiment, for example, each package 200 includes eight DRAM die, so that each module 400 includes 8×4×9=288 DRAM die.

Figure 7B:
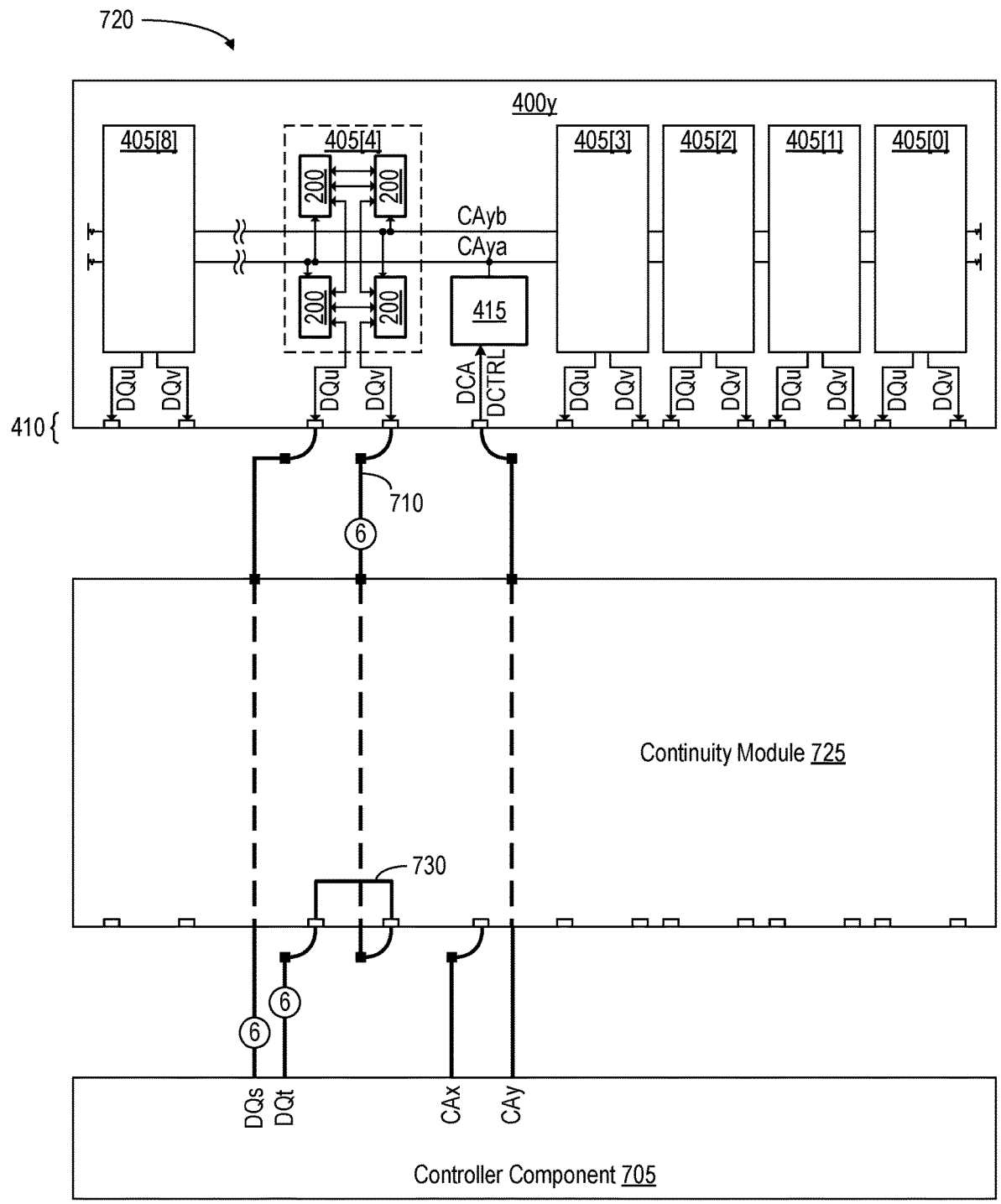
FIG. 7B depicts a memory system 720 with one module 400$y$ configured in the full-width (byte-wide) mode of FIG. 5A coupled to controller component 705.

FIG. 7B depicts a memory system 720 with one module 400y configured in the full-width (byte-wide) mode of FIG. 5A coupled to controller component 705. (The overall data width of module 400y is 72 (9×8) bits, with two strobe links per data byte.) A continuity module 725 supports a link group 730 that interconnects port DQt with link group 710, and thus to port DQv of module 400y. (Eight additional link groups 710/730 support the other ports DQt of controller 705.) Memory system 720 thus provides P-to-P data connections between controller component 705 and module 400y. Controller component 705 can communicate with any DRAM package 200 of module 400y via link groups DQs and DQt, as directed by control signals on port CAy. Control port CAx is not used in this example.

Figure 7C:
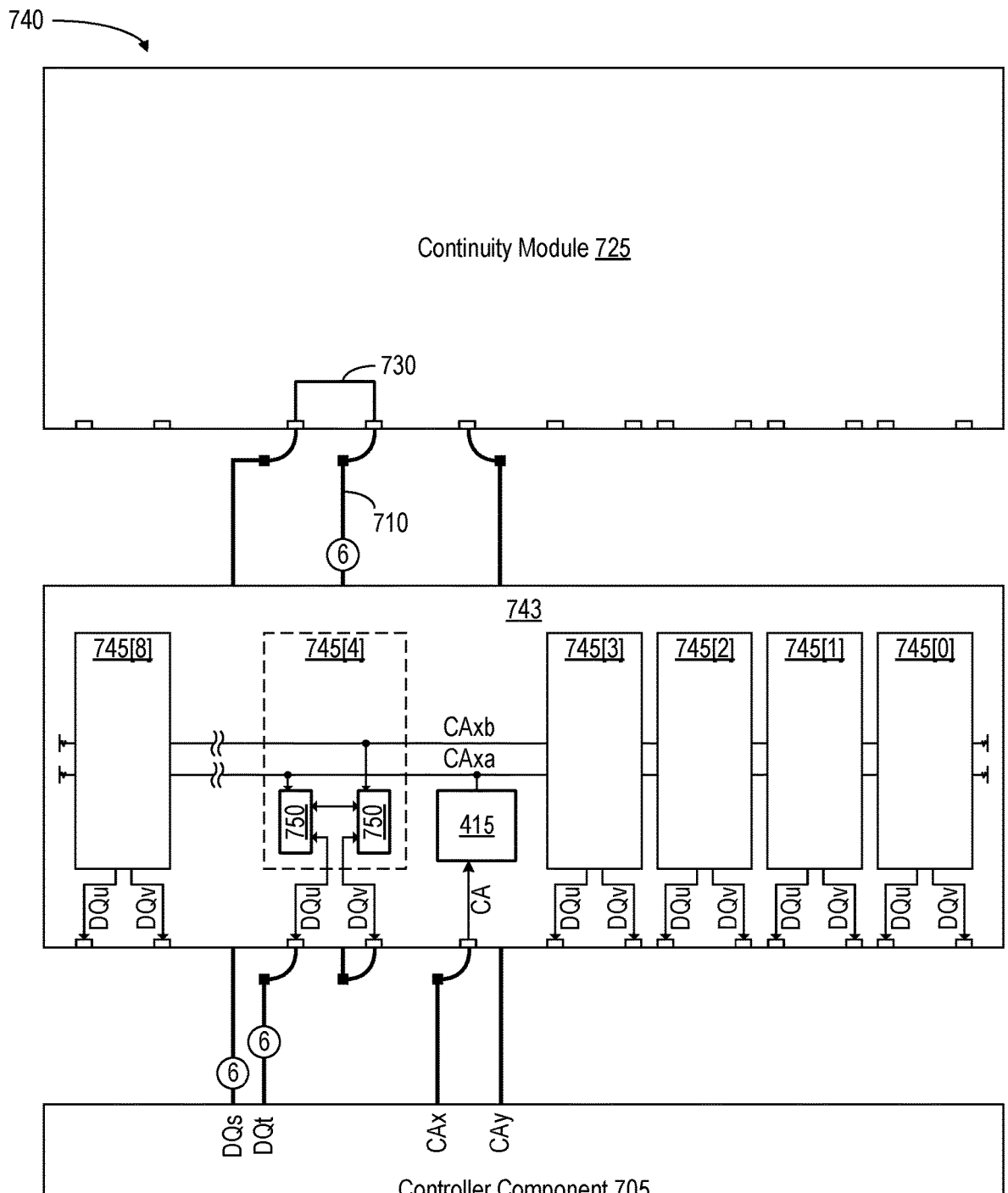
FIG. 7C depicts a memory system 740 with one module 743 having nine collections 745[8:0] of DRAM packages 750 in accordance with another embodiment.

FIG. 7C depicts a memory system 740 with one module 743 having nine collections 745[8:0] of DRAM packages 750 in accordance with another embodiment. Each package 750 includes two data ports DQa and DQb, as shown in cross section at the bottom left. One port is coupled to the module connector and the other to an adjacent package 750 in the same collection 745. The package interconnections allow each collection of packages, and thus module 743, to be configured to communicate data between both packages 750 via just one data link group in support of a half-width mode.

Figure 7D:
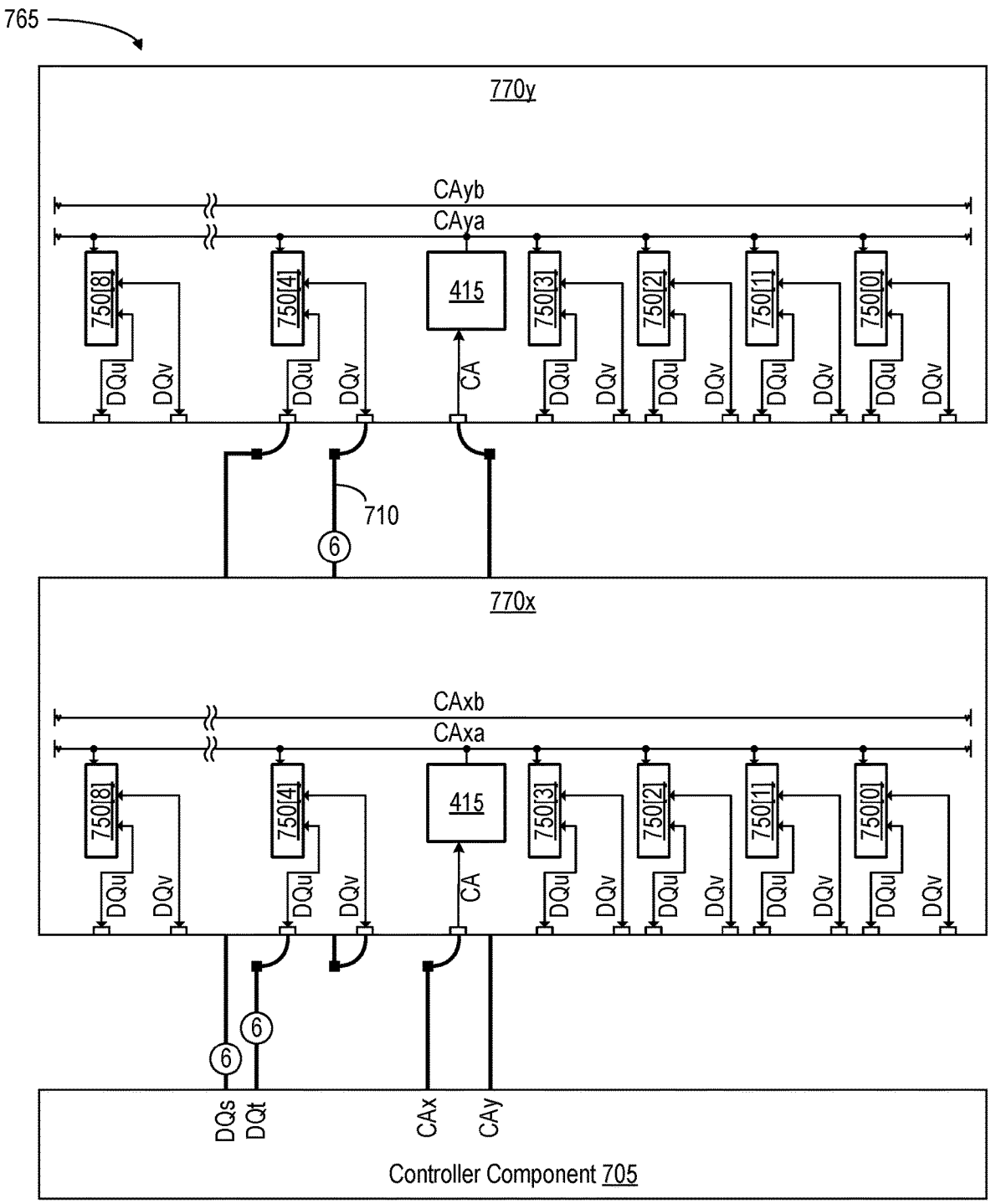
FIG. 7D depicts a memory system 765 with two modules 770$x$ and 700$y$ each having nine DRAM packages 750[8:0] rather than the collections of packages in prior examples.

FIG. 7D depicts a memory system 765 with two modules 770x and 700y each having nine DRAM packages 750[8:0] rather than the collections of packages in prior examples. Each package 750 again includes two data ports, but each is coupled to the module connector. DRAM packages 750 are configured to communicate via their respective ports DQu. Ports DQv and associated link group 710 are not used. Packages 750 communicate nibble-wide data, so one module 770 does not support full-width data. However, the DRAM die within packages 750 can be modified to support byte-wide data, and thus both wide and narrow module data widths, in other embodiments.

Figure 8A:
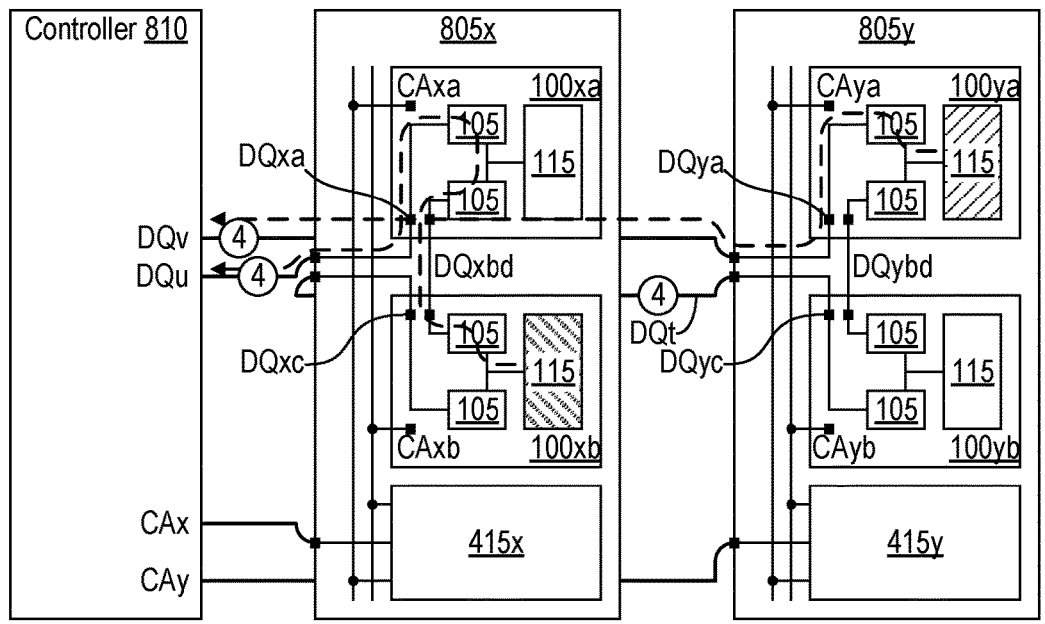
FIG. 8A depicts a memory system 800 in which a controller component 810 communicates with two memory modules 805$x$ and 805$y$.
Figure 8B:
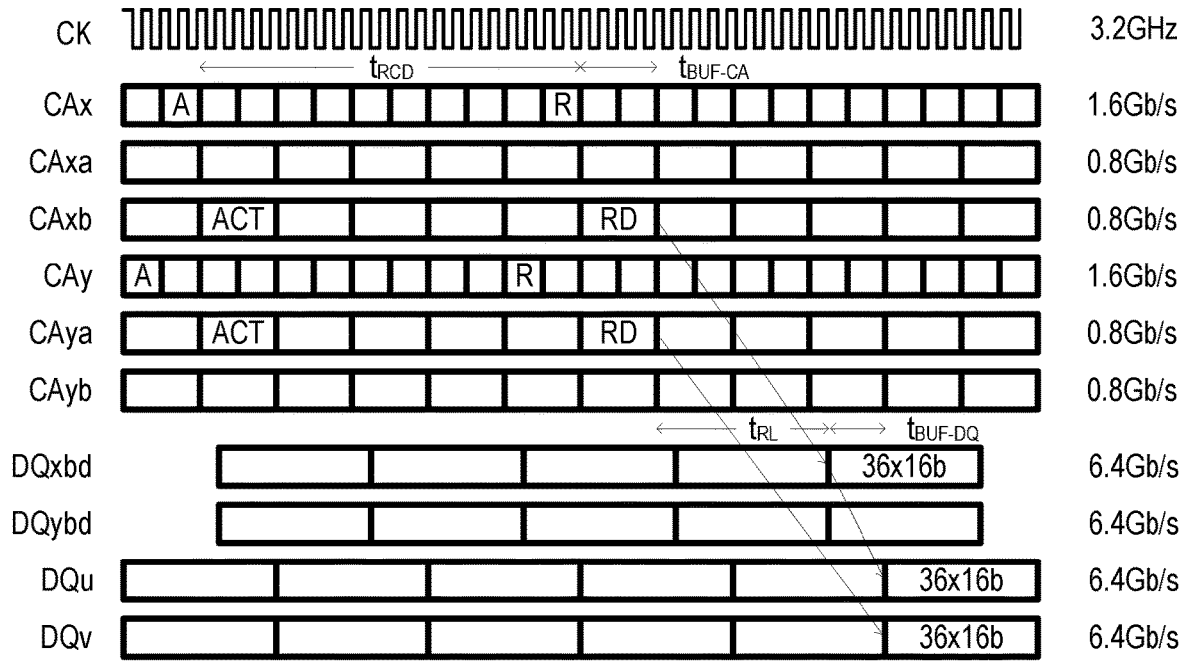
FIG. 8B is a timing diagram illustrating the operation of system 800 of FIG. 8A.

FIG. 8A depicts a memory system 800 in which a controller component 810 communicates with two memory modules 805x and 805y. Modules 805x and 805y are as detailed previously, each including a pair of DRAM components 100 interconnected physically and electrically into a single package (e.g., like package 200 of FIG. 2). Each module includes nine such pairs, but eight are omitted for ease of illustration. FIG. 8B is a timing diagram detailing a read transaction for system 800 of FIG. 8A. The "x" and "y" designations on modules 805 match the connections of the primary CA buses CAx and CAy.

With reference to FIG. 8B, a column at the right indicates the nominal signaling rate of the various buses for an embodiment in which the primary DQ signaling rate is 6.4 Gb/s. The relative signaling rate of the buses can scale up or down with the primary DQ rate.

Each of the two read transactions includes an activate command (labeled "A" or "ACT"), a read command (labeled "R" or "RD"), and read data (labeled "36x16b"). The commands and data for each transaction are pipelined. This means that they occupy fixed timing positions with respect to the transaction, and it also means that the transactions overlap other transactions.

The timing intervals that are used are shorter than what might be considered typical at present. For example, the ACT to RD command spacing (tRCD) is shown as 6.25 ns, but would more commonly be about 12.5 ns. This compression of the timing scale is done for clarity, and does not affect the technical accuracy; the pipeline timing works equally well with a tRCD delay of 6.25 ns.

The tBUF-CA interval (0.93 ns) is the propagation delay needed by buffer components 415 to retransmit the information on the primary CA links CAx and CAy to the secondary CA links CAxa/CAxb and CAya/CAyb. The tRL interval (3.125 ns) is the column read delay between the RD command and the read data needed by the DRAM. The tBUF-DQ (0.93 ns) interval is the propagation delay needed by the DRAM on module 805x to retransmit the information on the DQxa and DQxc links to the primary DQu links. This is because the DRAM component accessed on module 805x does not have a direct connection to controller 810.

The access on module 805y has a configurable delay (tBUF-DQ) inserted in its read access so that the read data is returned to the controller on the DQu and DQv primary links at approximately the same time. This incremental delay makes it easier for the controller to manage the memory pipeline. The diagram for write transactions would be similar, but with different fixed timing positions of commands and data.

The transaction granularity that is shown is 72 bytes, or 72 bits with an eight-bit burst length. There are enough command time slots to allow each of the primary DQu and DQv time slots to be filled with data. Each transaction performs a random row activation and column access on each 72 bytes ("36x16b"). Other transaction granularities are possible. Note that there are 576 bits forming each 72-byte transfer block. Each transfer block communicates 64 bytes of data with an extra eight bytes to allow for the transfer and storage of a checksum for an EDC (error detection and correction) code.

If there are bank conflicts in the transaction stream, and if the transaction stream switches between read and write operations, then data slots are skipped. This form of bandwidth inefficiency is typical of memory systems. No additional resource conflicts are introduced by the modifications that have been made to this improved memory system.

The "x" and "y" transactions begin with an activation command "A" on the CAx and CAx buses. These buses have a point-to-point topology and a signaling rate of 1.6 GB/s (one-quarter the signaling rate of the point-to-point DQ buses).

Address buffers 415x and 415y each receives the primary CA bus and retransmits the information on the CAxa/CAxb and CAya/CAyb module buses. The CA module buses operate at 0.8 Gb/s, half the speed of the primary CA buses and ⅛th the speed of the primary DQ buses. This is because the module CA buses have a multi-drop topology; each of the module CA buses connects to half of the DRAM components on the module. The "x" and "y" transactions continue with a read command "R" on the CAx and CAy buses, which is retransmitted on the secondary CAxb and CAya module buses.

The two read transactions access two of the four DRAM components, components 100ya and 100xb, in this example. The "x" transaction accesses component 100xb, which means that the read data will be driven onto secondary links DQxbd to the upper DRAM component 100xa and then conveyed to controller 810 on the DQu primary links. The "y" transaction accesses component 100ya, which drives the read data onto the DQv primary links. An incremental delay is added to the "y" transaction so the read data DQu and DQv arrive at controller 810 at approximately the same time. In this example, the delay to retransmit from the DQxbd links to the DQu bus is approximately three clock cycles (about one nanosecond). This example provides one cycle for serialization latency (two data bits per clock cycle) plus two additional clock cycles for clock skew between the two DRAM components (±1 clock cycle). The other DRAM components in the four DRAM component set would be accessed with a high order address bit set differently in the CAx and CAy commands. The DQt primary bus is not used; the interface circuitry on the DRAM components connected to this bus will typically be disabled by a control register field.

Figure 8C:
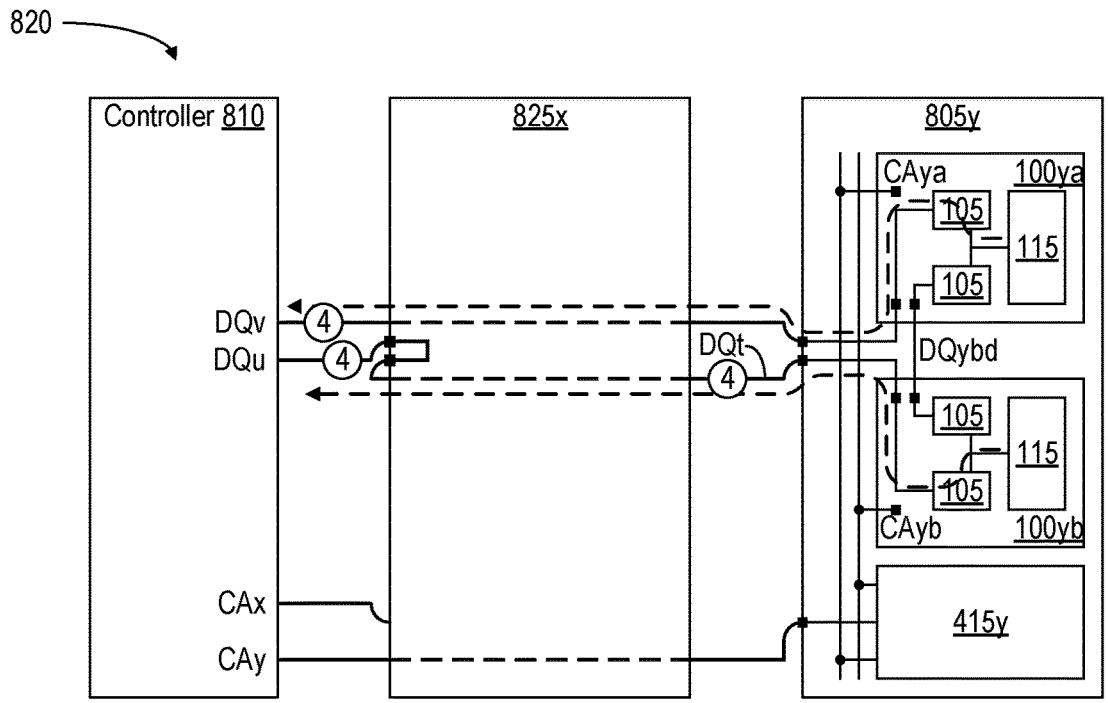
FIG. 8C depicts a memory system 820 similar to system 800 of FIGS. 8A and 8B but with one module 805$y$ and a continuity module 825$x$.

FIG. 8C depicts a memory system 820 similar to system 800 of FIGS. 8A and 8B but with one module 805y and a continuity module 825x. Continuity module 825x connects the DQu link group to the DQt link group; each of the four DQ links and the two DQS links is connected with a controlled impedance wire that matches (approximately) the impedance of the motherboard wires. The CAx bus is not connected to anything on the continuity module.

Figure 8D:
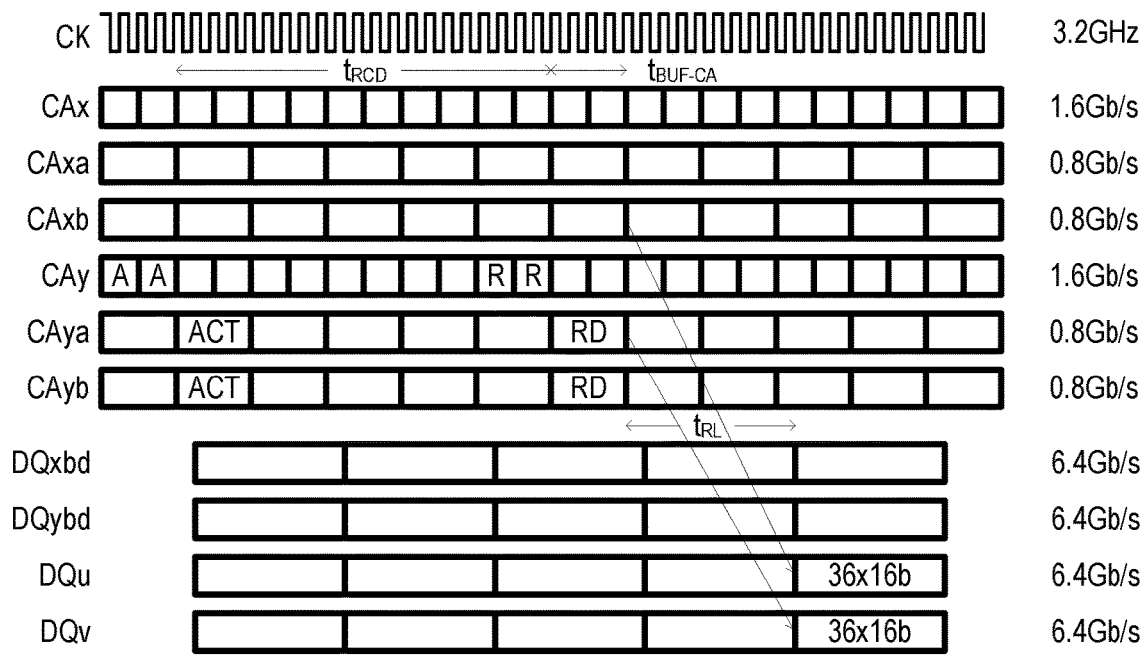
FIG. 8D is a timing diagram detailing a read transaction for system 800 of FIG. 8C.

FIG. 8D is a timing diagram detailing a read transaction for system 800 of FIG. 8C. As with the example of FIG. 8B, this diagram indicates the nominal signaling rate of the various buses, assuming that the primary DQ signaling rate is 6.4 Gb/s. Each of two read transactions includes an activate command (labeled "A" or "ACT"), a read command (labeled "R" or "RD"), and read data (labeled "36x16b"). The commands and data for each transaction are pipelined.

This means that they occupy fixed timing positions with respect to the transaction, and it also means that the transactions overlap other transactions.

The fixed timing positions may be shifted slightly from the positions in other configurations. This shifting will not cause a scheduling problem for controller 810 because these configurations are static; e.g. the configuration is detected at system initialization, and after the appropriate control register field(s) are set, the configuration will not be changed.

The timing intervals that are used are shorter than what are present in a typical system. For example, the ACT to RD command spacing (tRCD) is shown as 6.25 ns, but could be e.g. about 12.5 ns in other embodiments. This compression of the timing scale is done for clarity, and does not affect the technical accuracy; the pipeline timing works equally well with a tRCD delay of 6.25 ns.

The tBUF-CA interval (0.93 ns) is the propagation delay needed by the RCD buffer component to retransmit the information on the primary CA links to the secondary CA links. The tRL interval (3.125 ns) is the column read delay between the RD command and the read data needed by the DRAM. The tBUF-DQ (0.93 ns) interval does not appear in this example because the DRAM components have a direct primary connection to the controller. In other one-module configurations this propagation delay could be present if a DRAM component needs to transfer its data through another DRAM component on module 805y. The diagram for write transactions would be similar, but with different fixed timing positions of commands and data.

The transaction granularity that is shown is 64 bytes; that is, there are enough command slots to allow each of the primary DQu and DQv slots to be filled with data. Each transaction performs a random row activation and column access on each 64 bytes ("36×16b"). Other transaction granularities are possible.

There are 576 bits forming each 64 byte transfer block. The extra 64 bits allow for the transfer and storage of a checksum for an EDC (error detection and correction) code. If there are bank conflicts in the transaction stream, and if the transaction stream switches between read and write operations, then data slots will need to be skipped. This form of bandwidth inefficiency is common in memory systems. No additional resource conflicts are introduced by the modifications that have been made to this improved memory system.

Returning to FIG. 8D, the "x" and "y" transactions begin with an activation command "A" on the CAy bus. The CAx bus is not used in this configuration. These buses have a point-to-point topology and a signaling rate of 1.6 GB/s (one-quarter the signaling rate of the point-to-point DQ buses). RCD buffer component 415y receives the primary CAy bus and retransmits the information on the CAyb and CAya module buses. The CA module buses operate at 0.8Gb/s, half the speed of the primary CA buses and ⅛th the speed of the primary DQ buses. This is because the module CA buses have a multi-drop topology; each of the module CA buses connects to half of the DRAM components on the module. The "ya" and "yb" transactions continue with a read command "R" on the CAy bus. This is retransmitted on the CAyb and CAya module buses. The two read transactions have accessed the two DRAM components 100ya and 100ya that respectively connect to the DQv and DQu nibble groups. Where each package contains a stack of DRAM die, each transaction accesses the memory in one die in each component.

The "yb" transaction accesses the lower DRAM component 100yb in this example. (DRAM components 100 with multiple DRAM die may be referred to as a DRAM "stack"). This means that the read data will be driven onto the DQt primary links through continuity module 825x, and then returned to the controller on the DQu primary links. The incremental propagation time of the "yb" read data through the continuity module is small enough that it can be absorbed in the clock skew management circuitry, so the read data on DQu and DQv arrive at the controller at approximately the same time.

Figure 8E:
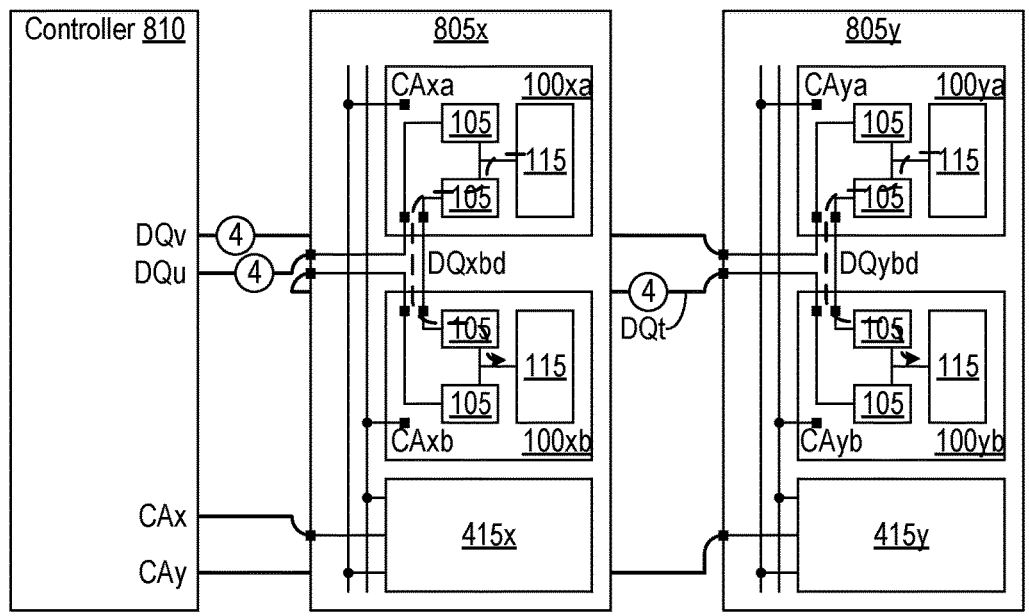
FIG. 8E depicts system 800 of FIG. 8A but illustrates how the interface logic can accommodate direct transfers between two DRAM components on the same module.
Figure 8F:
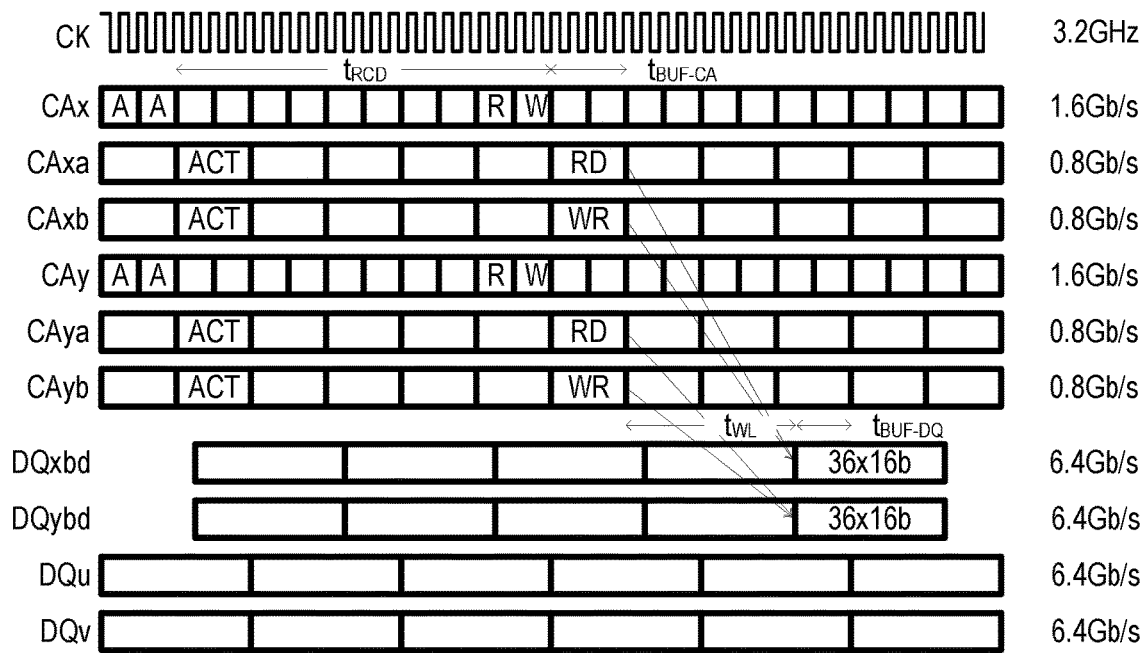
FIG. 8F shows the waveforms of the various CA and DQ buses, and also indicates the nominal signaling rate of those buses in accordance with one embodiment.

FIG. 8E depicts system 800 of FIG. 8A but illustrates how the interface logic can accommodate direct transfers between two DRAM components on the same module. FIG. 8F shows the waveforms of the various CA and DQ links, and also indicates the nominal signaling rate of those buses in accordance with one embodiment. Each direct transfer operation involves a read transaction in one DRAM component 100 and a write transaction in another component 100 on the same module 805. Transactions can be carried out simultaneously on each module, so that four transactions take place, twice as many as in the read transaction examples of FIGS. 8A-8D.

Each of the two read transactions includes an activate command (labeled "A" or "ACT"), a read command (labeled "R" or "RD"), and read data (labeled "36×16b"). Each of the two write transactions includes an activate command (labeled "A" or "ACT"), a write command (labeled "W" or "WR"), and write data (labeled "36×16b"). In this case, the write data results from the read transaction. The timing of the write transaction (tWL) is configured to approximately match the read transaction (tRL) with respect to the interval from the column command to the column date. The data is transferred on the shared DQ bus between the DRAM components (link groups DQyab and DQxab in this case).

The timing may be described as "approximately" matching to recognize that each DRAM component 100 will accommodate a small amount of variability in the timing of its interface. This is because the position of the receive data and transmit data will drift over a small range during system operation. Interfaces 105 accommodate this dynamic drift, with the result that any drift (within the allowed range) will not affect the operation of the memory system.

When the command-to-data interval for a write operation matches a read operation, controller 810 accounts for the bank usage when a transfer transaction or a write transaction to a DRAM component 100 is followed by a read transaction to the same DRAM component. This resource management is a common function of memory controllers.

The commands and data for each transaction are pipelined. This means that they occupy fixed timing positions with respect to the transaction, and it also means that the transactions overlap other transactions. The timing intervals are shorter than what are present in a typical system. For example, the ACT to RD command spacing (tRCD) is shown as 6.25 ns, but would be about 12.5 ns for a real DRAM component. This compression of the timing scale is done for clarity, and does not affect the technical accuracy; the pipeline timing works equally well with a tRCD delay of 6.25 ns.

The tBUF-CA interval (0.93 ns) is the propagation delay needed by the RCD buffer component 415 to retransmit the information on the primary CA links to the secondary CA links. The tRL interval (3.125 ns) is the column read delay between the RD command and the read data needed by the DRAM component 100. The tBUF-DQ (0.93 ns) interval does not appear in this example because each DRAM read package has a direct connection to the DRAM write component destination. In other configurations this propagation delay could be present if a DRAM read component transfers data through another DRAM component on the module to the DRAM write component destination.

The transaction granularity that is shown is 64 bytes; that is, there are enough command slots to allow each of the primary DQu and DQv slots to be filled with data. Each transaction performs a random row activation and column access on each 64 bytes ("36×16b"). Other transaction granularities are possible. Each byte is assumed to be 9b in size in this example. The ninth bit accounts for the checksum of an EDC (error detection and correction) code.

Returning to the waveform diagram, it can be seen that the "x" and "y" transactions begin with an activation command "A" on the CAx and CAy buses. These buses have a point-to-point topology and a signaling rate of 1.6 GB/s (one-quarter the signaling rate of the point-to-point DQ buses). Each RCD buffer components 415x and 415y receives the primary CA bus and retransmits the information on the CAxa, CAxb, CAya, and CAyb module buses. All four of the CA module buses are used for the transfer transaction.

The CA module buses operate at 0.8 Gb/s, half the speed of primary CA buses CAx and CAy and ⅛th the speed of the primary DQ buses. This is because the module CA buses have a multi-drop topology; each of the two module CA buses connects to ½ of the DRAM components on the module. The "x" and "y" transactions continue with two read commands "R" and two write commands "W" on the CAx and CAy buses. This is retransmitted as two read commands "RD" and two write commands "WR" on the CAxa, CAxb, Cya, and CAyb buses. The two read transactions have accessed two DRAM components 100xa and 100ya, and the two write transactions have accessed the other two DRAM components 100xb and 100yb. The "x" read transaction accesses the upper DRAM component 100xa. The read data will be driven onto the DQxab primary links to the lower DRAM component 100xb, to be written to the selected DRAM die. Likewise, the "y" read transaction accesses the upper DRAM component 100ya. The read data will be driven onto the DQyab primary links to the lower DRAM component 100yb to be written to the selected DRAM die. A different DRAM component 100 would be accessed with a high-order address bit set differently in the CAx and CAy commands. The primary data interfaces associated with link groups DQu, DQv, and DQt are not used for these transfers; the interfaces 105 connected to these link groups can be disabled by e.g. a control register field during such transfer operations.

Figure 8G:
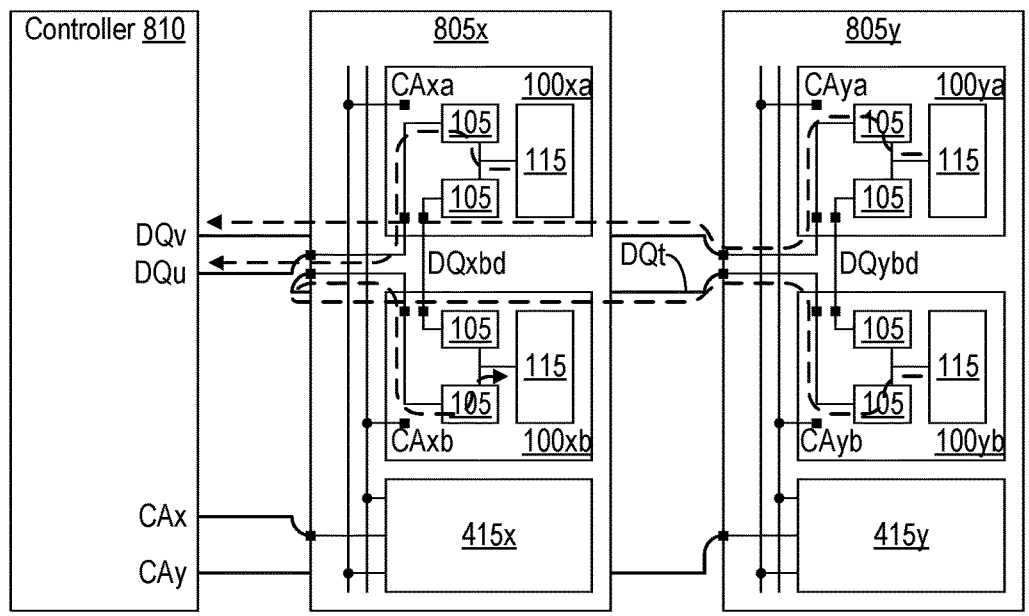
FIG. 8G depicts system 800 of FIG. 8A but illustrates how the interface logic can accommodate direct transfers between DRAM components on different modules.
Figure 8H:
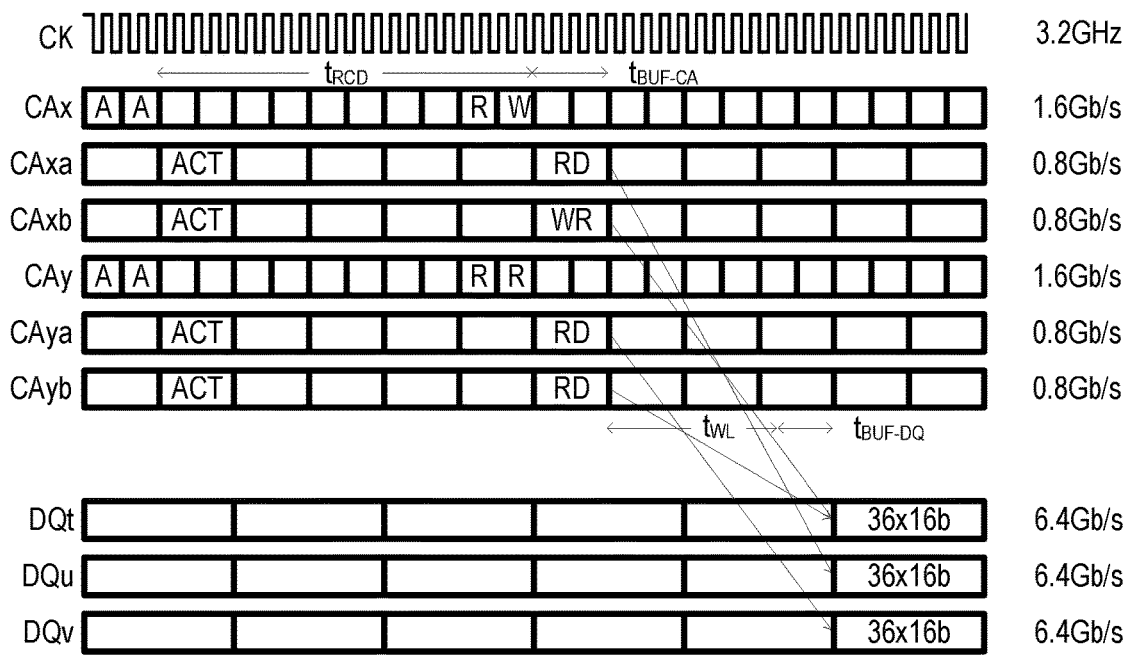
FIG. 8H shows the waveforms of the various CA and DQ buses, and also indicates the nominal signaling rate of those buses in accordance with one embodiment.

FIG. 8G depicts system 800 of FIG. 8A but illustrates how the interface logic can accommodate direct transfers between DRAM components on different modules. FIG. 8H shows the waveforms of the various CA and DQ buses, and also indicates the nominal signaling rate of those buses in accordance with one embodiment.

An illustrated transfer operation involves a read transaction in DRAM component 100yb of module 805y and a write transaction in DRAM component 100xb of module 805x. These transactions can be carried out concurrently with two additional read transactions, so that four transactions take place. Each of the three read transactions includes an activate command (labeled "A" or "ACT"), a read command (labeled "R" or "RD"), and read data (labeled "36×16b"). The single write transaction includes an activate command (labeled "A" or "ACT"), a write command (labeled "W" or "WR"), and write data (labeled "36×16b").

In this case, the write data results from one of the read transactions. The timing of the write transaction is configured to approximately match the read transaction with respect to the interval from the column command to the column date. The data is transferred on the shared link group DQt between the two modules.

When the command-to-data interval for a write operation matches a read operation, controller 810 accounts for the bank usage when a transfer transaction or a write transaction to a DRAM component 100 is followed by a read transaction to the same component. This resource management is a common function performed by memory controllers. The commands and data for each transaction can be pipelined. As in prior examples, the depicted timing intervals are relatively short.

The tBUF-CA interval (0.93 ns) is the propagation delay needed by the RCD buffer component to retransmit the information on the primary CA links to the secondary CA links. The tRL interval (3.125 ns) is the column read delay between the RD command and the read data needed by the DRAM. The tBUF-DQ (0.93 ns) interval does not appear in this example because each DRAM component has a direct connection its destination (to controller 810 or to DRAM write component). In other configurations this propagation delay could be present if a DRAM read component needs to transfer its data through another DRAM component on the module to the DRAM write component destination.

The transaction granularity that is shown is 64 bytes; that is, there are enough command slots to allow each of the primary DQu and DQv slots to be filled with data. Each transaction performs a random row activation and column access on each 64 bytes ("36×16b"). Other transaction granularities are possible.

There are 576 bits forming each 64 byte transfer block, which allow an extra eight bytes for the transfer and storage of a checksum for an EDC (error detection and correction) code. The "x" and "y" transactions begin with a activation command "A" on the CAx and CAy buses. These buses have a point-to-point topology and a signaling rate of 1.6 GB/s (one-quarter the signaling rate of the point-to-point DQ buses). Address buffer components 415x and 415y each receives the same primary CA information and retransmits the information on the CAxa, CAxb, CAya, and CAyb module buses. Alternatively, the primary CA information can be different to activate and address difference locations on modules 805x and 805y. All four of the CA module buses will be used for the transfer transaction.

The CA module buses operate at 0.8 Gb/s, half the speed of the primary CA buses and ⅛th the speed of the primary DQ buses. This is because the module CA buses have a multi-drop topology; each of the module CA buses connects to half of the DRAM components on the module. The "x" and "y" transactions continue with three read commands "R" and one write command "W" on the CAx and CAy buses. This is retransmitted as three read commands "RD" and one write command "WR" on the CAxa, CAxb, CAya, and CAyb buses. The three read transactions have accessed three of the four DRAM components, and the write transaction has accessed the other DRAM component in this example.

The figure shows one of the nine sets of DRAM components 100a/100b on each module. The four transactions have each accessed one of the DRAM components in each set. In the case of an access to the primary DRAM component, some additional delay will be added to the access time so that the read data is transmitted on the primary DQ in the same relative time slot. This incremental delay makes it easier for the controller to manage the memory pipeline. The DQxbd and DQybd link groups are not required in this example; the involved interface circuitry 105 can be disabled by the command decode logic in the primary DRAM component of each package.

In the foregoing description and in the accompanying drawings, specific terminology and drawing symbols have been set forth to provide a thorough understanding of the present invention. In some instances, the terminology and symbols may imply specific details that are not required to practice the invention.

For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments.

The term "memory" refers to electronic data storage systems, packages, devices, and collections of packages and devices used in computers. Computer memory commonly stores bits of binary data in arrays of memory cells form on an integrated circuit (IC) die and arranged in rows and columns. Component circuitry within these dies can be implemented using metal oxide semiconductor (MOS) technology, bipolar technology or any other technology in which logical and analog circuits may be implemented.

With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition).

A signal driving circuit is said to "output" a signal to a signal receiving circuit when the signal driving circuit asserts (or de-asserts, if explicitly stated or indicated by context) the signal on a signal line coupled between the signal driving and signal receiving circuits.

A signal line is said to be "activated" when a signal is asserted on the signal line, and "deactivated" when the signal is de-asserted. Additionally, the prefix symbol "/" attached to signal names indicates that the signal is an active low signal (i.e., the asserted state is a logic low state). A line over a signal name is also used to indicate an active low signal. The term "coupled" is used herein to express a direct connection as well as a connection through one or more intervening circuits or structures.

Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

What is claimed is:

1. A memory module comprising:
    a first memory package and a second memory package, each of the first memory package and the second memory package including:
        a first memory component and a second memory component, each of the first memory component and the second memory component having first component data interface circuitry with a first output driver to a first data port and second component data interface circuitry with a second output driver to a second data port, the first component data interface circuitry communicatively coupled to the second component data interface circuitry to transfer read data from the first data port to the second data port;
        wherein the first data ports of the first memory components in each of the first memory package and the second memory package are interconnected to forward the read data from the second memory package to the first memory package; and
        wherein the second data ports of the first memory component and the second memory component in each of the first memory package and the second memory package are interconnected.

2. The memory module of claim 1, wherein the first data ports of the second memory components in each of the first memory package and the second memory package are interconnected.

3. The memory module of claim 1, further comprising a third memory package having a first memory component and a second memory component, each of the first memory component and the second memory component having:
    a first data port; and
    a second data port;
    wherein the second data ports of the first memory component and the second memory component of the third memory package are interconnected.

4. The memory module of claim 3, wherein at least one of the second data ports of the first memory component and the second memory component in the first memory package are connected to the second data ports of the first memory component and the second memory component in the third memory package.

5. The memory module of claim 4, further comprising a fourth memory package having a first memory component and a second memory component, each of the first memory component and the second memory component having:
    a first data port; and
    a second data port;
    wherein the second data ports of the first memory component and the second memory component of the fourth memory package are interconnected.

6. The memory module of claim 5, wherein at least one of the first data ports of the first memory component and the second memory component of the fourth memory package is connected to the second data ports of the first memory component and the second memory component of the second memory package.

7. The memory module of claim 5, wherein the second data ports of the fourth memory package are connected to at least one of the second data ports of the third memory package.

8. The memory module of claim 7, further comprising a module connector to communicate data to and from the memory module, wherein the first data port of the first memory component of the fourth memory package is connected to the module connector.

9. The memory module of claim 8, wherein the first data port of the first memory component of the third memory package is connected to the module connector.

10. The memory module of claim 1, wherein at least one of the first memory component and the second memory component is a DRAM component.

11. The memory module of claim 1, the first memory component having a first command interface connected to the second memory component and the second memory component having a second command interface connected to the first memory component.

12. The memory module of claim 11, further comprising a buffer component connected to the command interface of the first memory component.

13. The memory module of claim 12, wherein the buffer component buffers address and control signals to the first memory component and the second memory component.

14. The memory module of claim 1, the second component data interface communicatively coupled to the first component data interface to transfer second read data from the second data port to the first data port.

15. A memory module comprising:
   a first memory package and a second memory package, each of the first memory package and the second memory package including:
      a first memory component and a second memory component, each of the first memory component and the second memory component having a first component data interface with a first data port and a second component data interface with a second data port, the first component data interface communicatively coupled to the second component data interface to transfer read data from the first data port to the second data port;
      wherein the first data ports of the first memory components in each of the first memory package and the second memory package are interconnected to forward the read data from the second memory package to the first memory package; and
      wherein the second data ports of the first memory component and the second memory component in each of the first memory package and the second memory package are interconnected;
   the first memory component comprising:
      a memory bank;
      a first multiplexer having respective first-multiplexer inputs communicatively coupled to the memory bank and the second data port of the first memory component; and
      a second multiplexer having respective second-multiplexer inputs communicatively coupled to the memory bank and the first data port of the first memory component.

16. The memory module of claim 15, the first memory component further comprising a third multiplexer having respective third-multiplexer inputs coupled to the first data port and the second data port and a third-multiplexer output coupled to the memory bank.

17. A memory system comprising:
   a controller component to issue commands and communicate data;
   at least one memory module coupled to the controller component to receive the commands and communicate the data, the at least one memory module having:
      a first memory package and a second memory package, each of the first memory package and the second memory package including:
         a first memory component and a second memory component, each of the first memory component and the second memory component having a command port coupled to the controller component, a first component data interface with a first data port, a second component data interface with a second data port, the first component data interface communicatively coupled to the second component data interface to transfer the data from the first data port to the second data port and from the second data port to the first data port;
         wherein the first data ports of the first memory components in each of the first memory package and the second memory package are interconnected to communicate the data between the first memory package and the second memory package; and
         wherein the second data ports of the first memory component and the second memory component in each of the first memory package and the second memory package are interconnected to communicate the data between the first memory components and the second memory components.

18. The memory system of claim 17, further comprising a continuity module to connect the at least one memory module to the controller component, the continuity module to communicate the commands and the data between the controller component and the at least one memory module.

19. The memory system of claim 17, wherein the first data ports of the second memory components in each of the first memory package and the second memory package are interconnected.

20. The memory system of claim 17, the at least one memory module further comprising a third memory package having a first memory component and a second memory component, each of the first memory component and the second memory component having:
   a first data port; and
   a second data port;
   wherein the second data ports of the first memory component and the second memory component of the third memory package are interconnected.

21. The memory system of claim 20, wherein at least one of the second data ports of the first memory component and the second memory component in the first memory package are connected to the second data ports of the first memory component and the second memory component in the third memory package.

* * * * *